(12) United States Patent
Igarashi et al.

(10) Patent No.: US 9,929,199 B2
(45) Date of Patent: Mar. 27, 2018

(54) RADIATION DETECTOR, IMAGING UNIT, AND IMAGING AND DISPLAY SYSTEM

(71) Applicant: SONY CORPORATION, Tokyo (JP)

(72) Inventors: Takahiro Igarashi, Kanagawa (JP); Izuho Hatada, Kanagawa (JP); Takeshi Kodama, Kanagawa (JP); Kiwamu Adachi, Kanagawa (JP); Shuichi Oka, Kanagawa (JP); Shun Mitarai, Kanagawa (JP); Hiizu Ootorii, Kanagawa (JP); Shusaku Yanagawa, Kanagawa (JP); Katsuji Matsumoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 14/908,319

(22) PCT Filed: Aug. 21, 2014

(86) PCT No.: PCT/JP2014/004290
§ 371 (c)(1),
(2) Date: Jan. 28, 2016

(87) PCT Pub. No.: WO2015/029389
PCT Pub. Date: Mar. 5, 2015

(65) Prior Publication Data
US 2016/0163754 A1 Jun. 9, 2016

(30) Foreign Application Priority Data

Aug. 28, 2013 (JP) ................................. 2013-177175
Jun. 6, 2014 (JP) ................................. 2014-117766

(51) Int. Cl.
*H01L 27/146* (2006.01)

(52) U.S. Cl.
CPC .. *H01L 27/14629* (2013.01); *H01L 27/14663* (2013.01); *H01L 27/14685* (2013.01)

(58) Field of Classification Search
CPC ......... H01L 27/14629; H01L 27/14663; H01L 27/14685
See application file for complete search history.

(56) References Cited

U.S. PATENT DOCUMENTS

| 7,772,604 B2 * | 8/2010 | Duong | ................... | H01L 33/58 257/95 |
|---|---|---|---|---|
| 2004/0211884 A1 * | 10/2004 | Fang | ................. | H01L 27/14601 250/214.1 |

(Continued)

FOREIGN PATENT DOCUMENTS

| JP | 07-027863 A | 1/1995 |
|---|---|---|
| JP | 09-325185 A | 12/1997 |

(Continued)

OTHER PUBLICATIONS

Office Action for JP Patent Application No. 2014-117766, dated Nov. 28, 2017, 9 pages of Office Action and 7 pages of English Translation.

*Primary Examiner* — Nathan W Ha
(74) *Attorney, Agent, or Firm* — Chip Law Group

(57) ABSTRACT

There is provided a radiation detector including: a plurality of photoelectric conversion devices, each photoelectric conversion device formed at least partially within an embedding layer and having a light receiving surface situated at least partially outside of the embedding layer, and a plurality of scintillator crystals, at least a first scintillator crystal of the plurality of scintillator crystals in contact with at least one light receiving surface at a proximal end, wherein a cross- (Continued)

section of the first scintillator crystal at the proximal end is smaller than a cross-section of the first scintillator crystal at a distal end.

17 Claims, 34 Drawing Sheets

(56) References Cited

U.S. PATENT DOCUMENTS

| | | | |
|---|---|---|---|
| 2007/0187787 A1* | 8/2007 | Ackerson | H01L 27/14625 257/428 |
| 2009/0189055 A1* | 7/2009 | Lin | H01L 27/14621 250/208.1 |
| 2009/0215281 A1* | 8/2009 | Mungekar | C23C 16/045 438/786 |
| 2011/0180714 A1* | 7/2011 | Okada | G01T 1/2018 250/354.1 |
| 2012/0091551 A1* | 4/2012 | Marenco | H01L 27/14625 257/432 |
| 2012/0153170 A1* | 6/2012 | Nariyuki | G01T 1/2018 250/368 |
| 2012/0181436 A1 | 7/2012 | Mollov | |
| 2013/0003926 A1* | 1/2013 | Okada | G01T 1/2928 378/62 |
| 2013/0082184 A1* | 4/2013 | Nakatsugawa | A61B 6/4208 250/366 |
| 2013/0140465 A1* | 6/2013 | Nishinou | G01T 1/24 250/366 |
| 2013/0161522 A1 | 6/2013 | Ishida et al. | |
| 2014/0027828 A1* | 1/2014 | Kim | H01L 31/118 257/292 |
| 2014/0263958 A1* | 9/2014 | Her | H01L 27/14685 250/208.1 |

FOREIGN PATENT DOCUMENTS

| | | |
|---|---|---|
| JP | 2000-009847 A | 1/2000 |
| JP | 2003-014850 A | 1/2003 |
| JP | 2008-051793 A | 3/2008 |
| JP | 2013-016772 A | 1/2013 |
| JP | 2013-113756 A | 6/2013 |
| JP | 2013-124976 A | 6/2013 |

* cited by examiner

[ Fig.1 ]
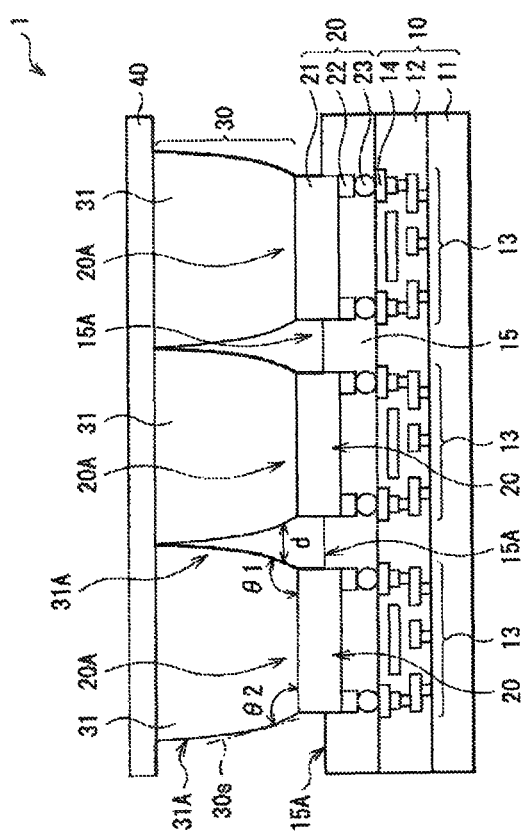

[Fig. 2]
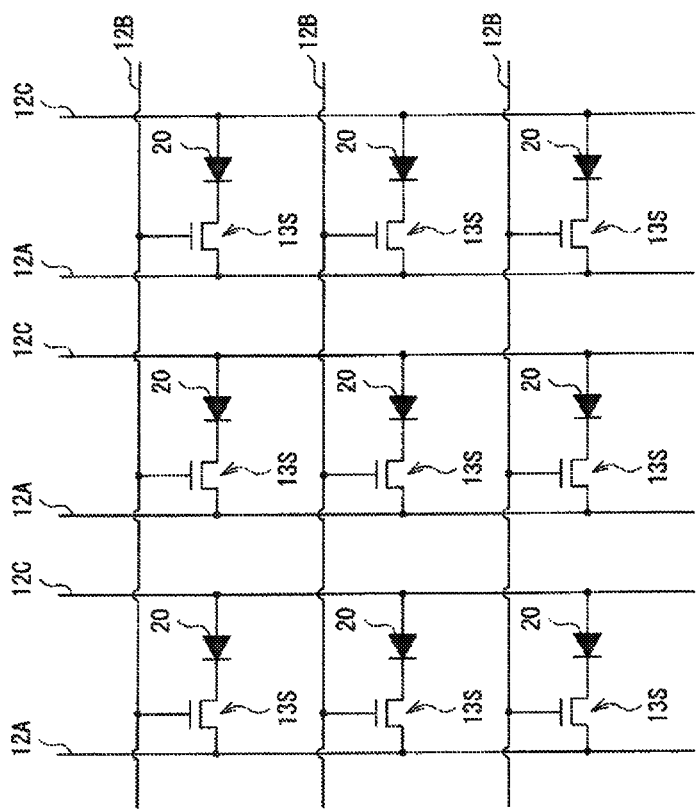

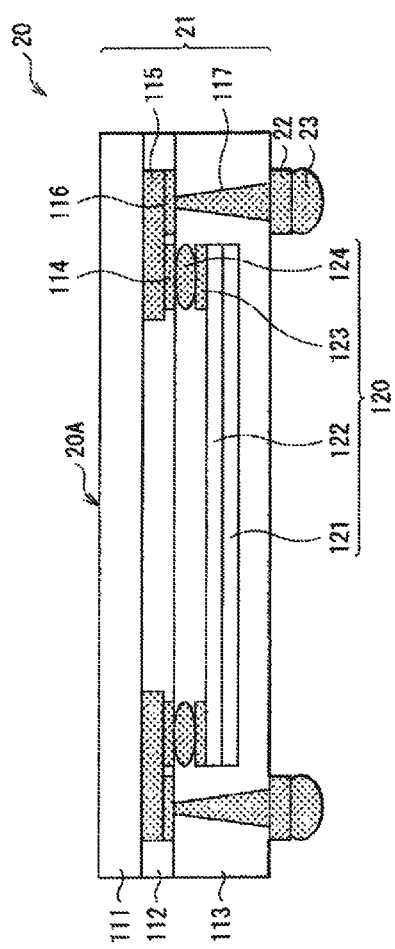
[Fig. 3]

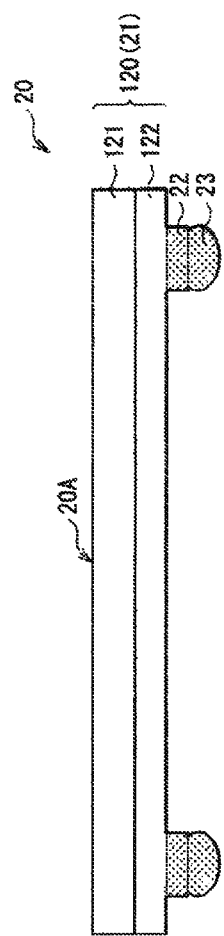
[Fig. 4]

[ Fig. 5 ]
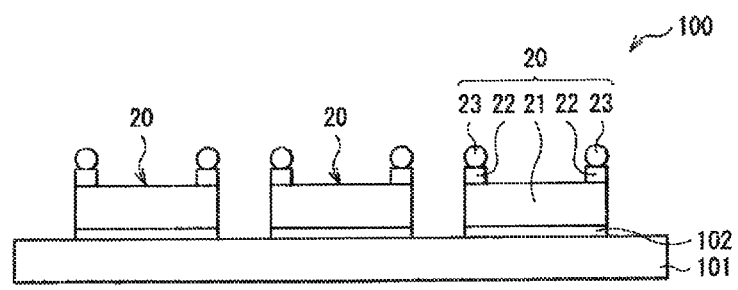
[ Fig. 6 ]
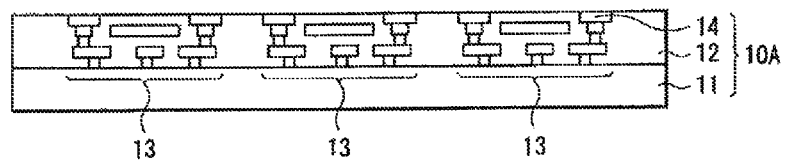
[ Fig. 7 ]
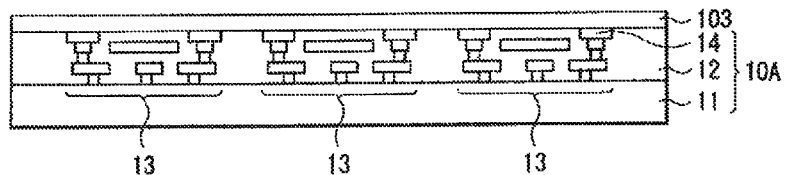

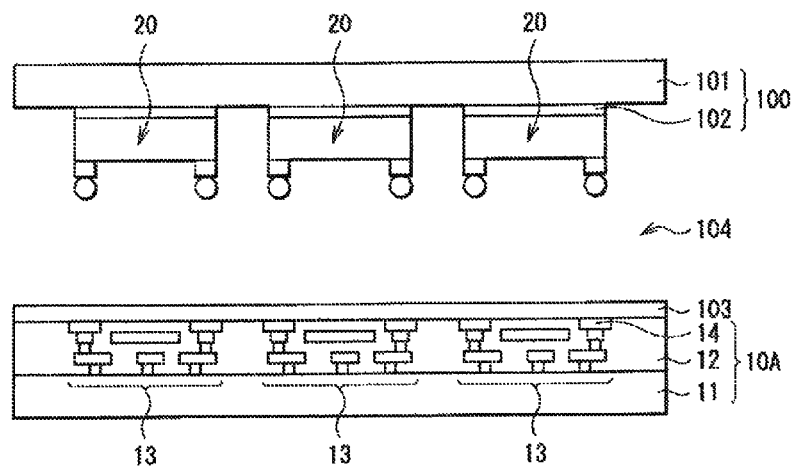
[Fig. 8]
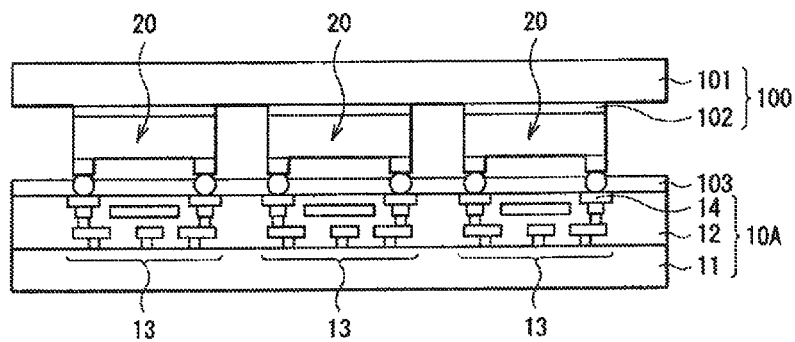
[Fig. 9]

[ Fig. 10 ]
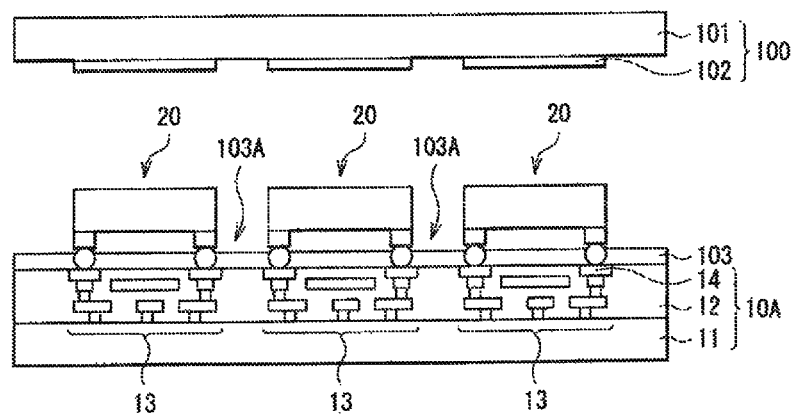
[ Fig. 11 ]
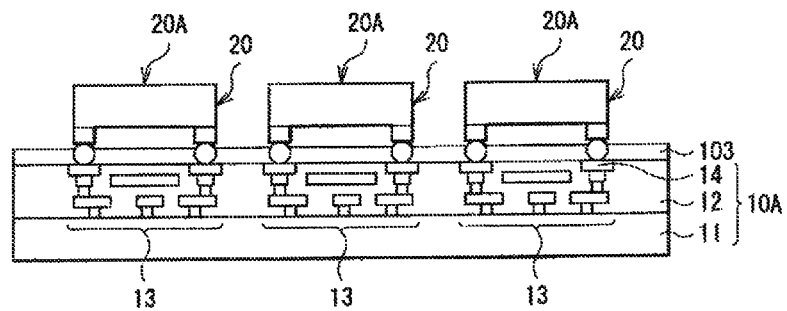

[Fig. 12]
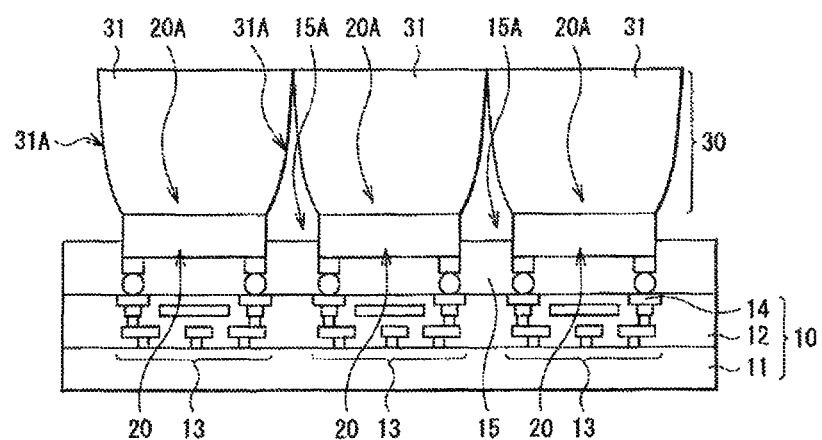

[Fig. 13]
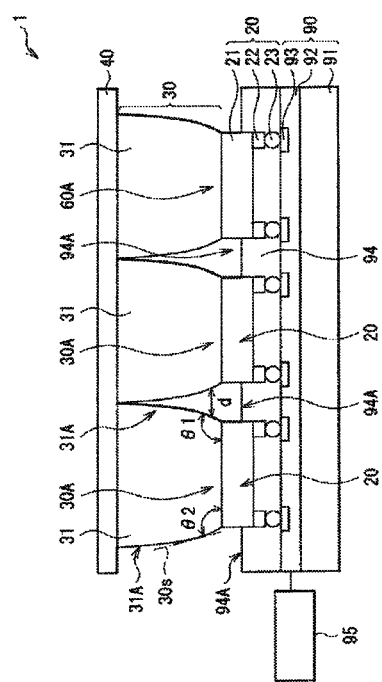

[Fig. 14]
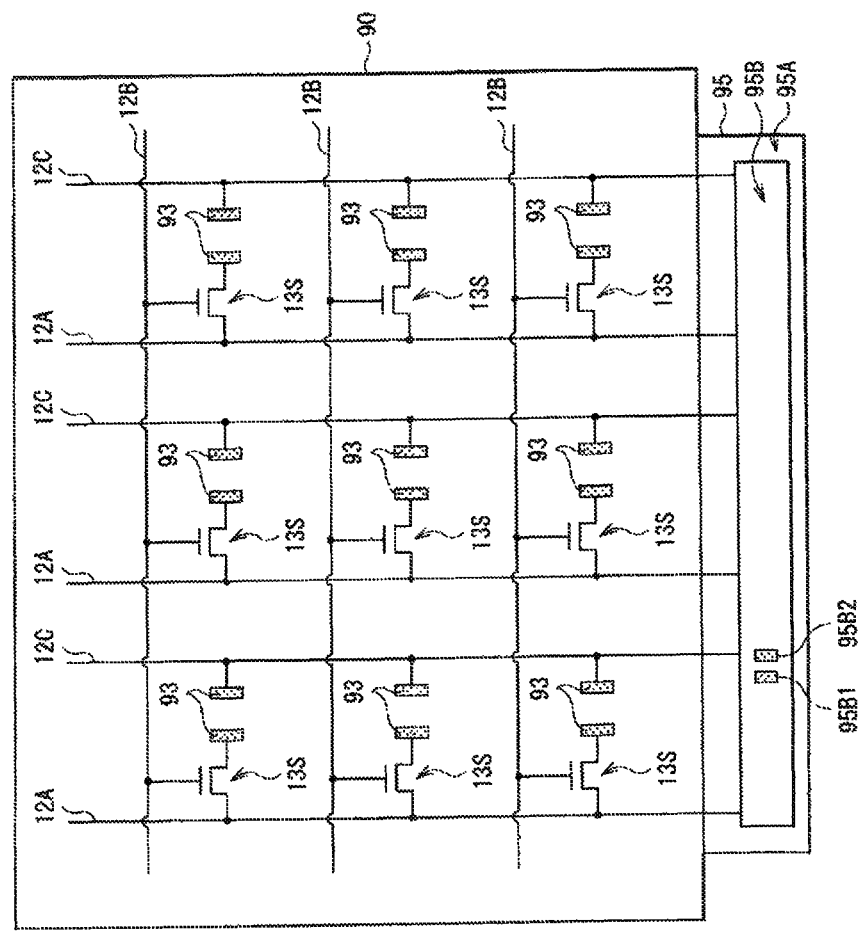

[Fig. 15]
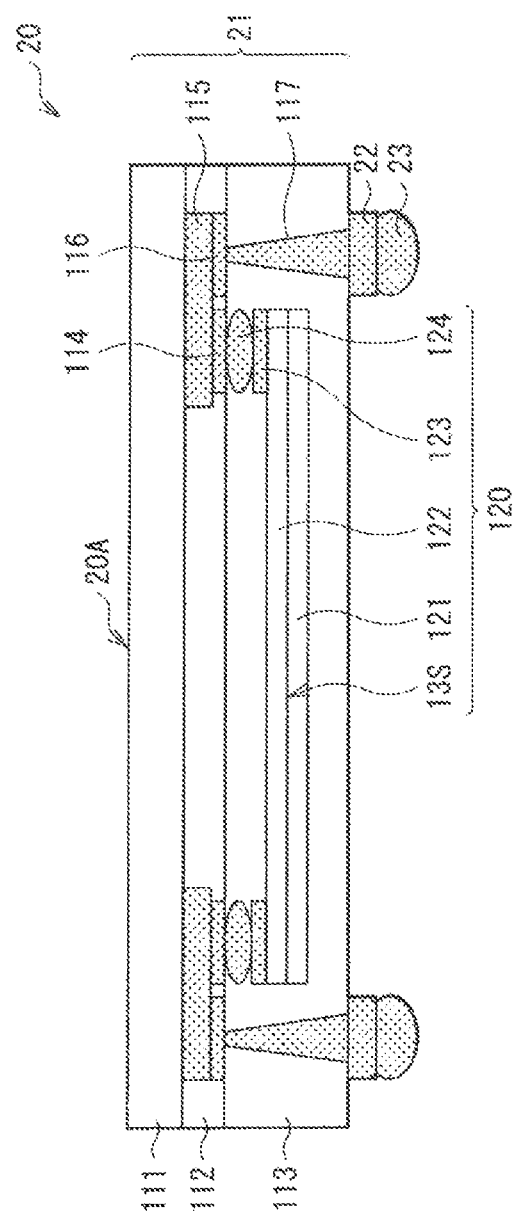

[Fig. 16]
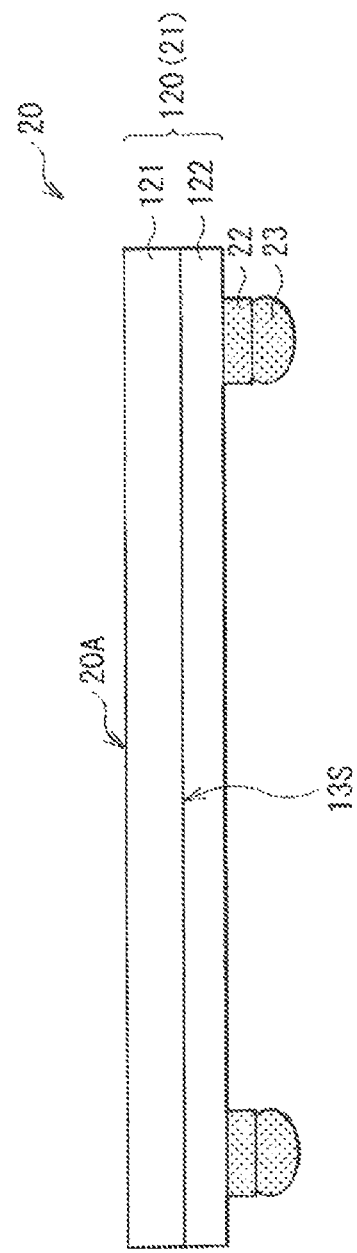

[Fig. 17]
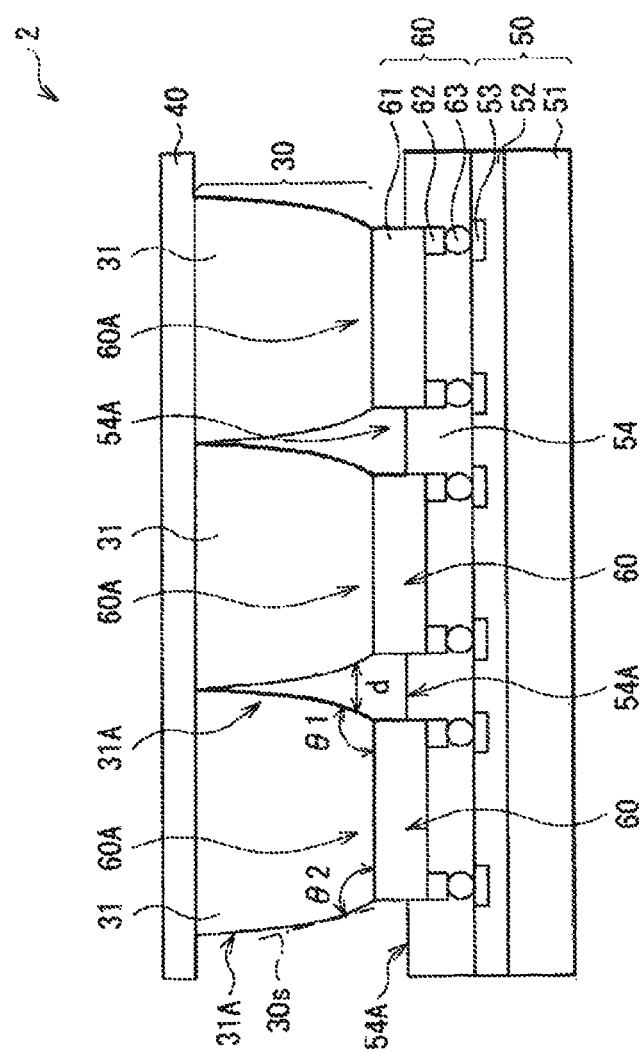

[Fig. 18]
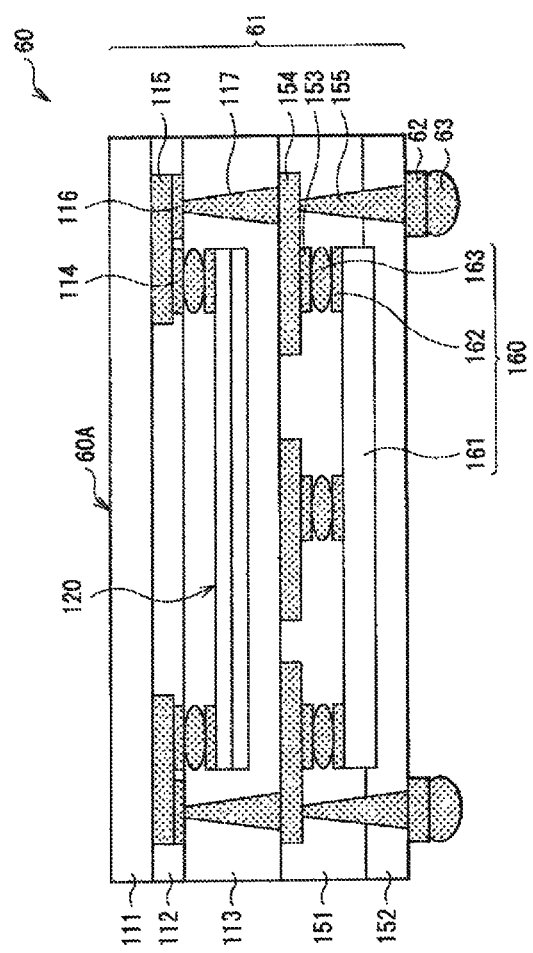

[Fig. 19]
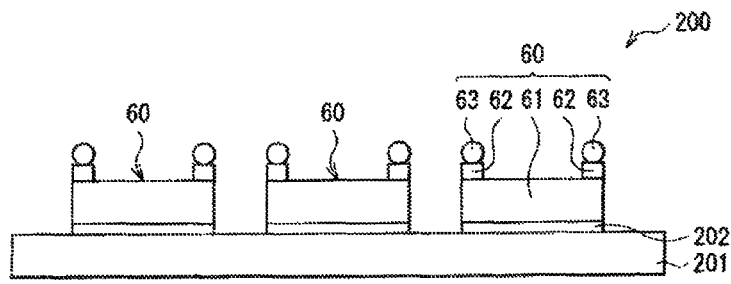
[Fig. 20]
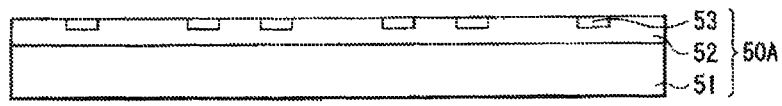
[Fig. 21]
[Fig. 22]
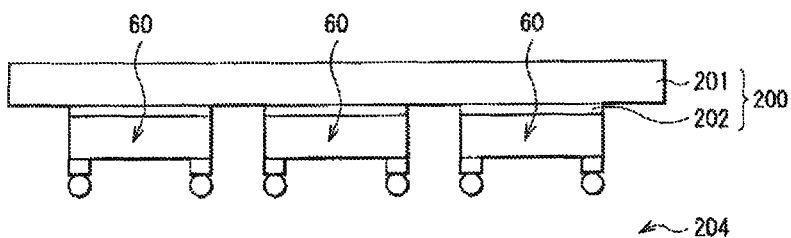
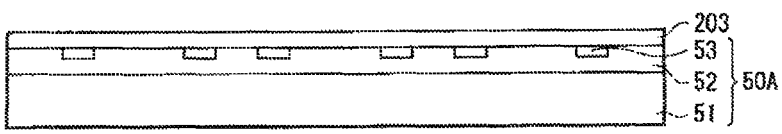

[Fig. 23]
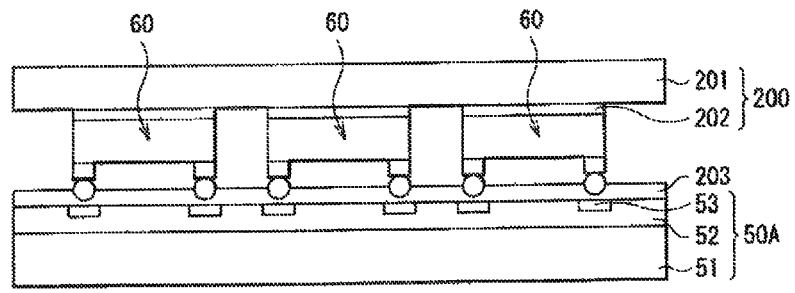
[Fig. 24]
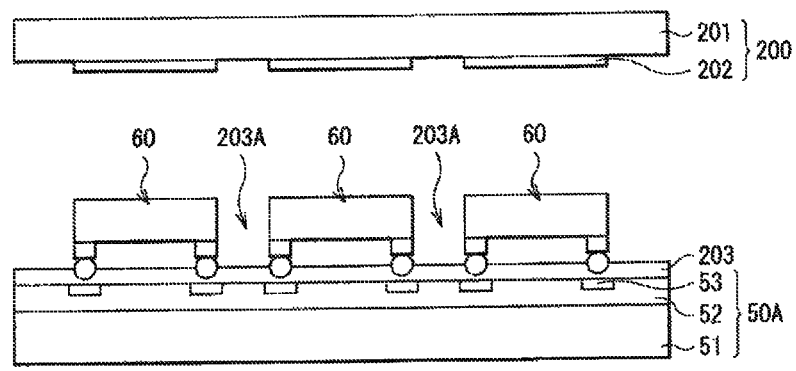
[Fig. 25]
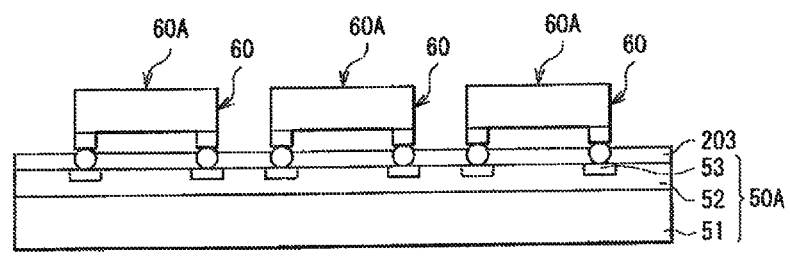

[Fig. 26]
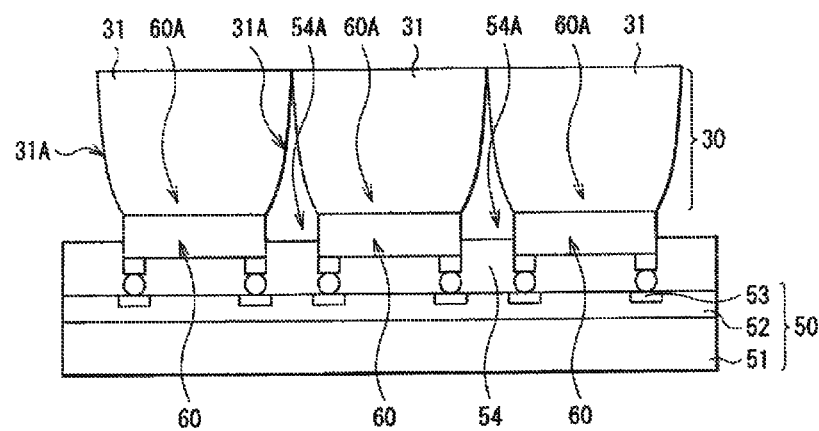

[Fig. 27]
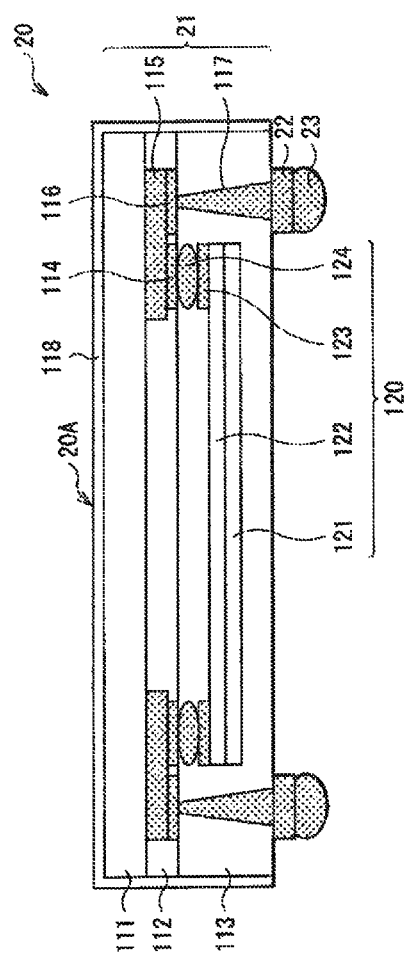

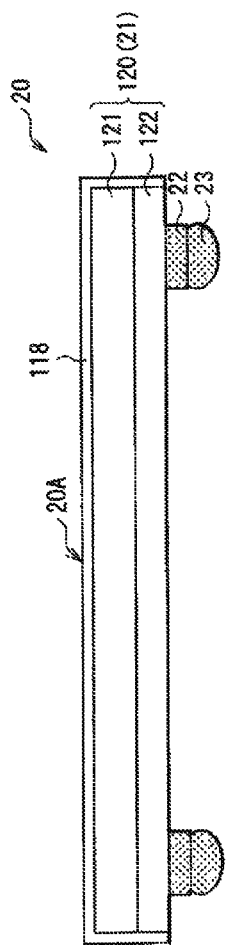
[Fig. 28]

[Fig. 29]
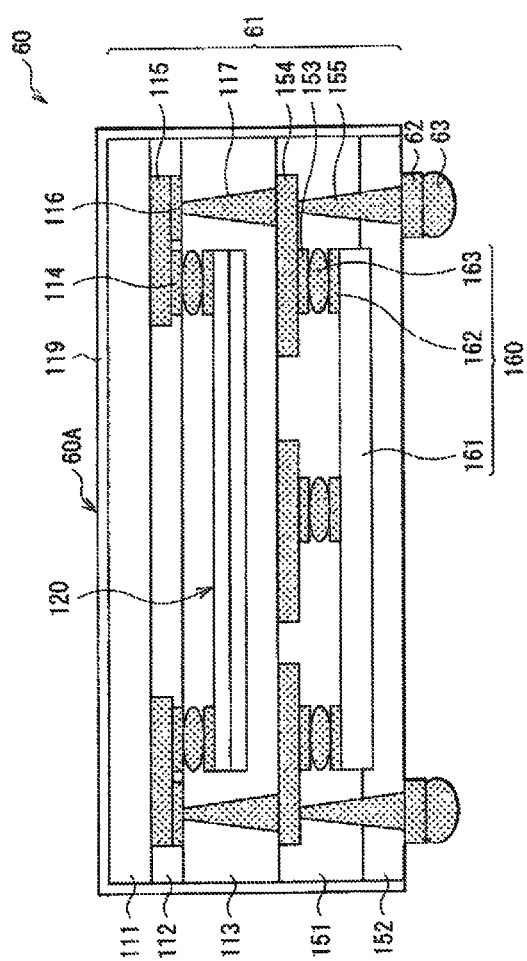

[Fig. 30]
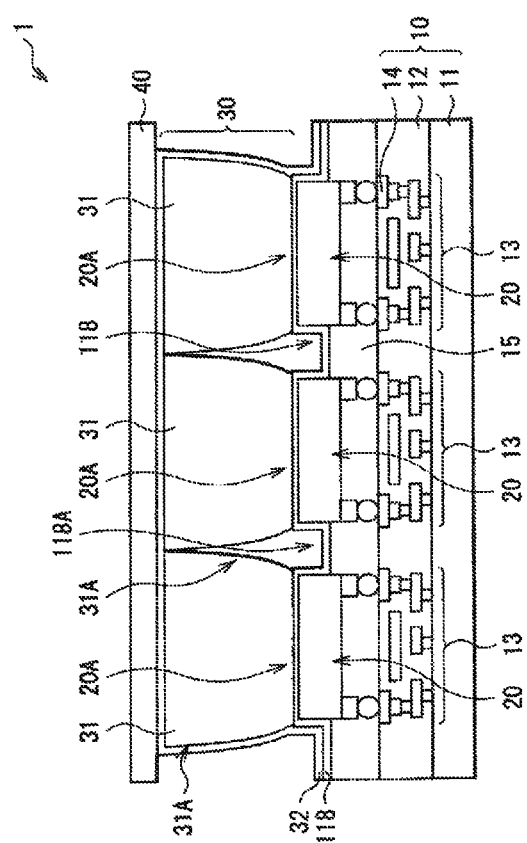

[Fig. 31]
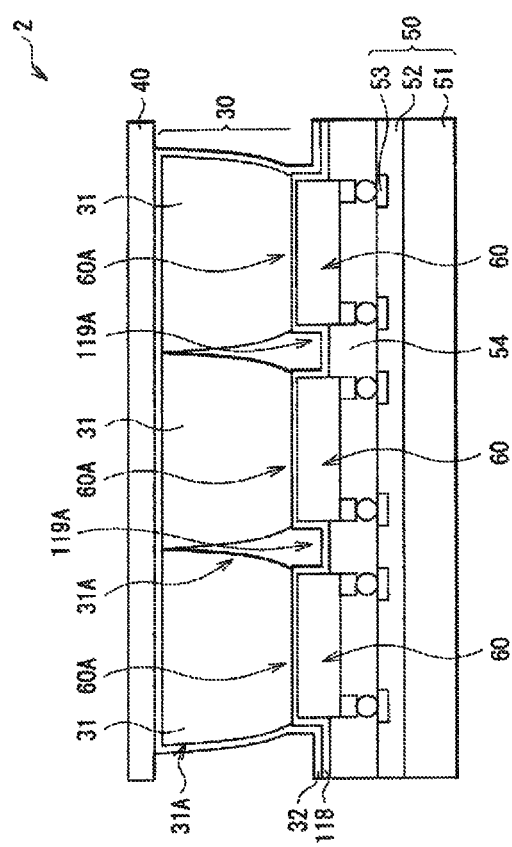

[Fig. 32A]
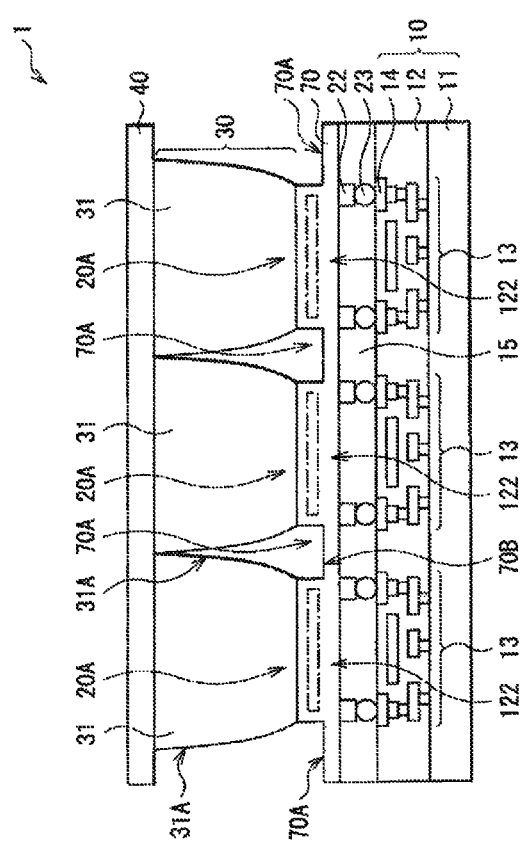

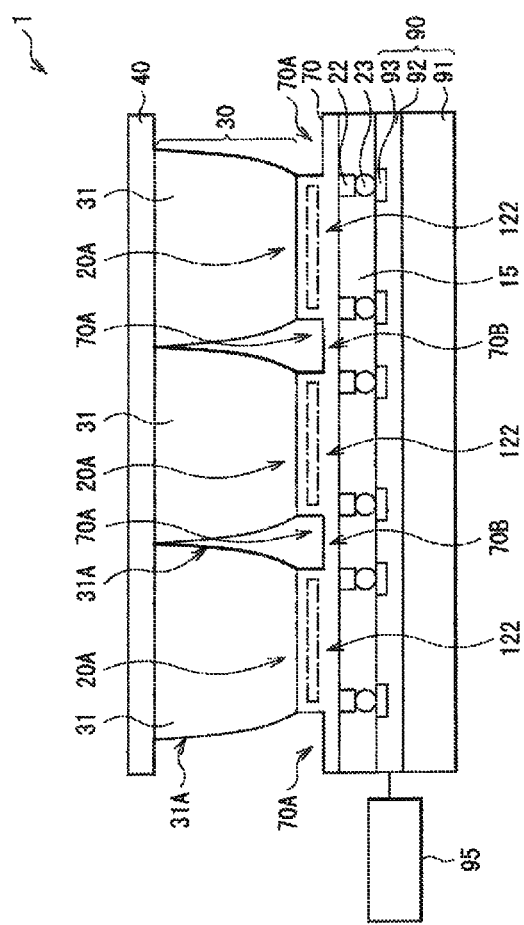
[Fig. 32B]

[Fig. 32C]
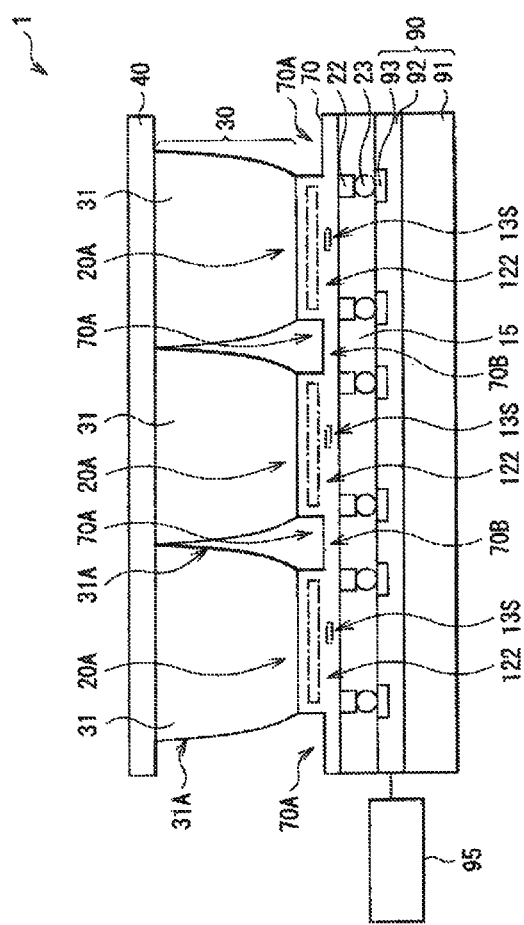

[Fig. 33]
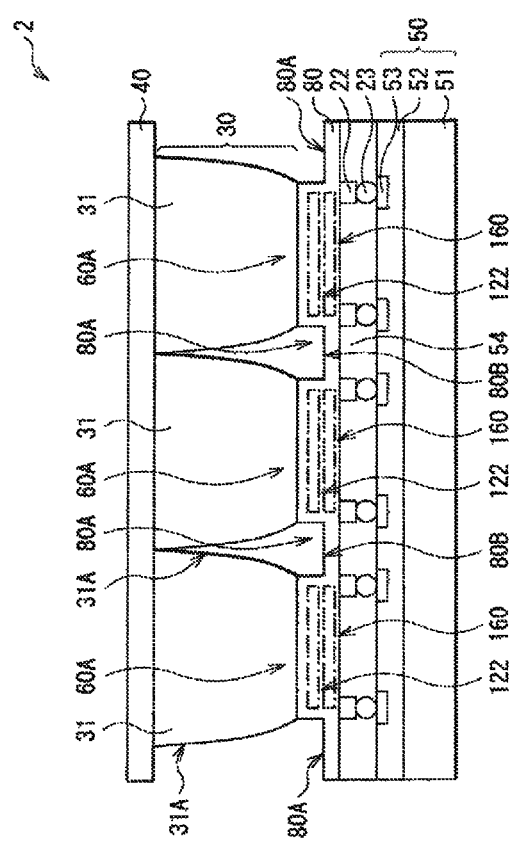

[Fig. 34]
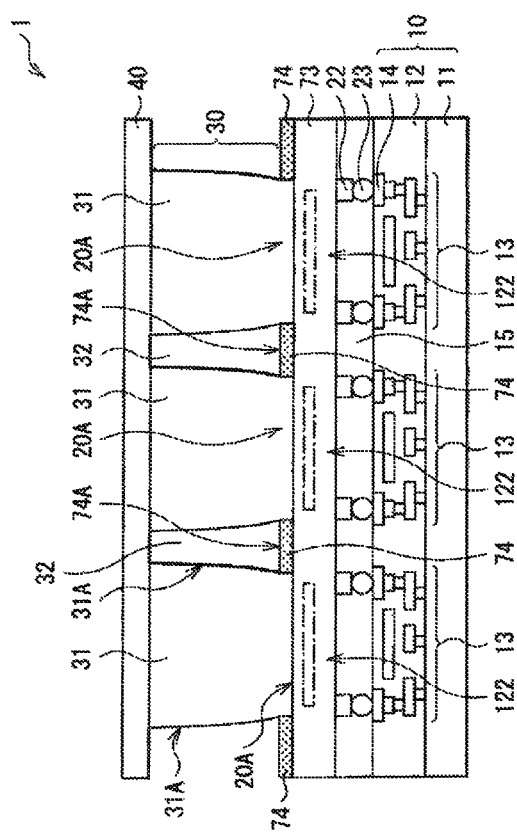

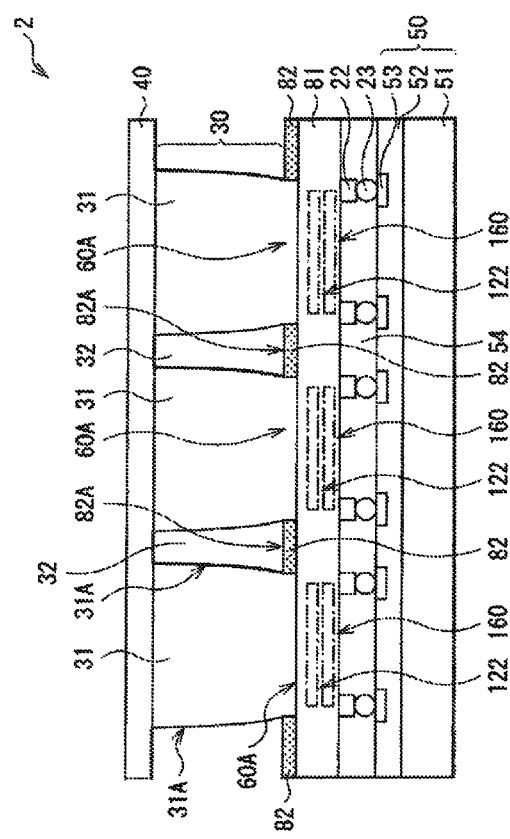
[Fig. 35]

[Fig. 36]
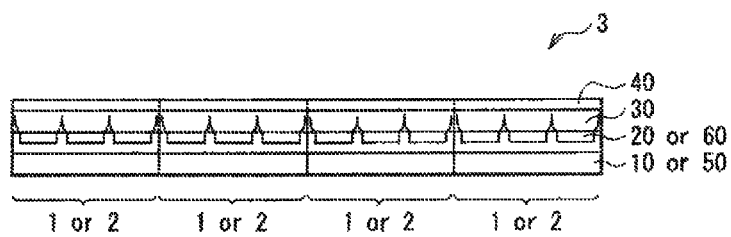
[Fig. 37]
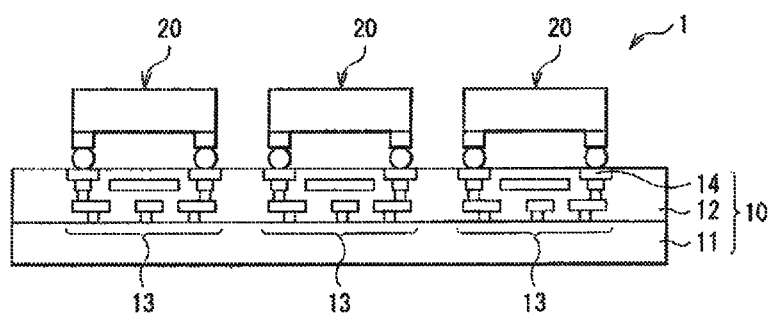
[Fig. 38]
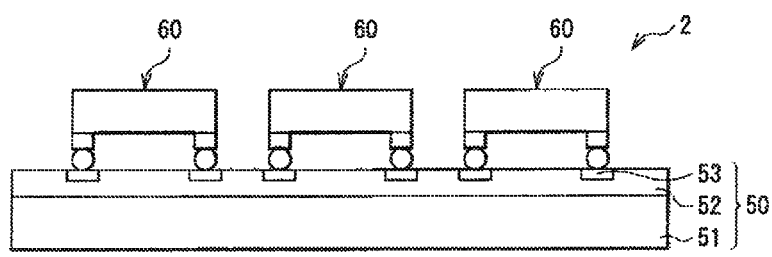

[ Fig. 39 ]
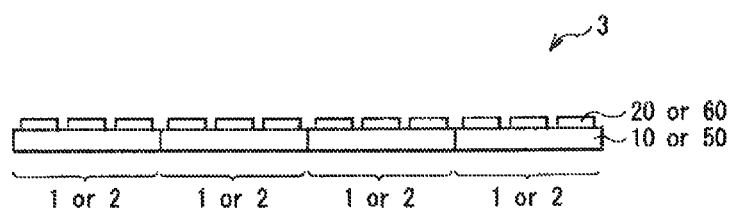

[ Fig. 40 ]
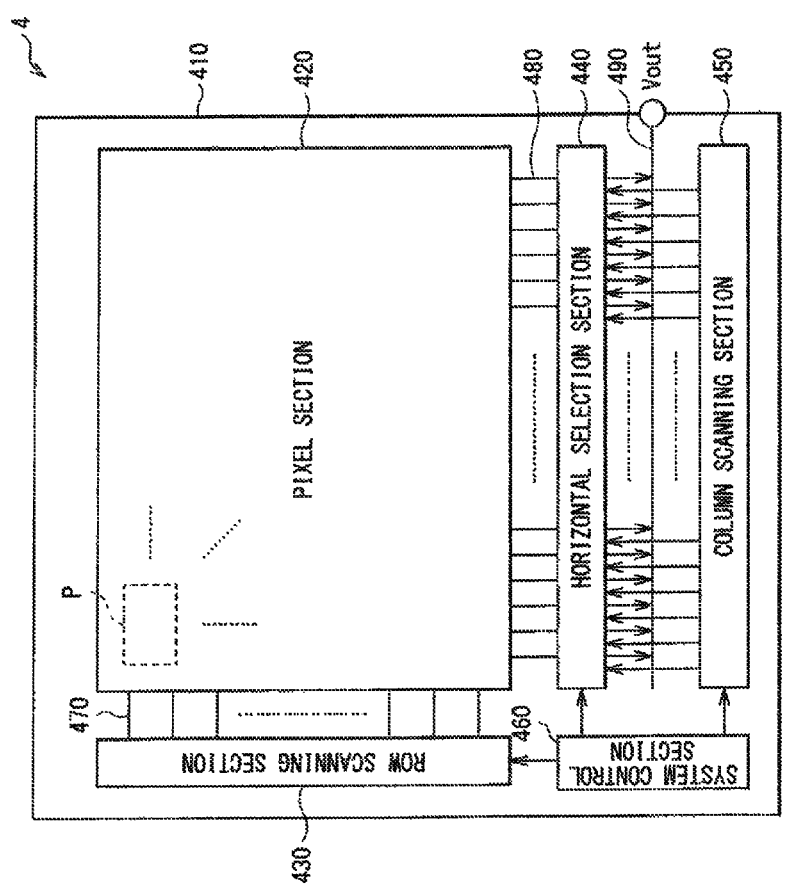

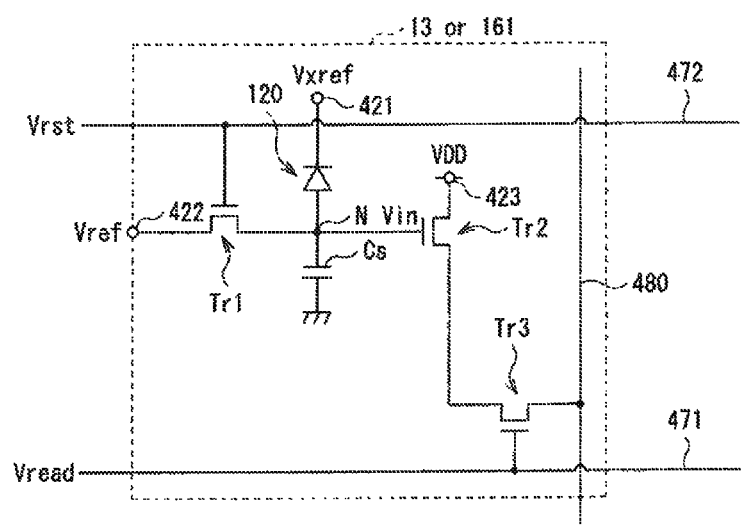
[Fig. 41]

[Fig. 42]
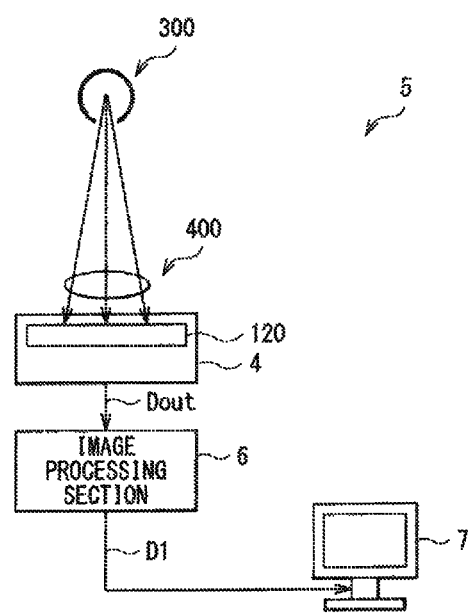

[Fig. 43]
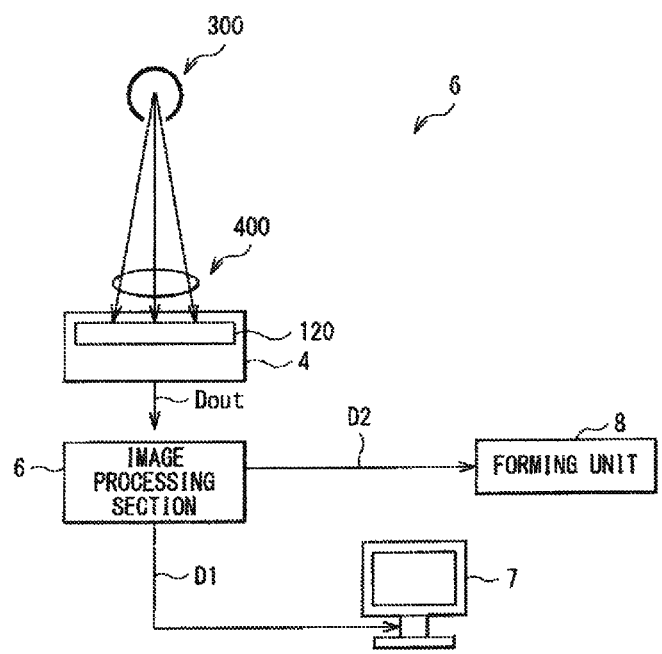

RADIATION DETECTOR, IMAGING UNIT, AND IMAGING AND DISPLAY SYSTEM

CROSS REFERENCE TO RELATED APPLICATIONS

This application claims priority to Japanese Priority Patent Application JP 2013-177175 filed Aug. 28, 2013, the entire contents of which are hereby incorporated by reference.

TECHNICAL FIELD

The present technology relates to a radiation detector that detects radiation such as alpha rays, beta rays, gamma rays, and X-rays, and to a method of manufacturing the radiation detector. Also, the present technology relates to an imaging unit and an imaging and display system that include the radiation detector.

BACKGROUND ART

Various imaging units have been proposed as an imaging unit that includes a photoelectric conversion device built in each pixel (imaging pixel). For example, PTL 1 refers to a radiation imaging unit as an example of such an imaging unit that includes a photoelectric conversion device.

CITATION LIST

Patent Literature

[PTL1]
JP 2011-135561A

SUMMARY

Technical Problem

Generally, in an imaging unit as that described above, an image is obtained by driving a plurality of pixels. There has been proposed various techniques to achieve higher image quality for thus-obtained image. However, it is desired to propose an imaging unit that is capable of achieving further higher image quality.

It is desirable to provide a radiation detector capable of achieving higher image quality, and a method of manufacturing such a radiation detector. It is also desirable to provide an imaging unit and an imaging and display system that include such a radiation detector.

Solution to Problem

According to an embodiment of the present technology, there is provided a radiation detector including: a plurality of photoelectric conversion regions each configured to convert light incident on a light receiving surface into a current signal; a discontinuous surface formed around the light receiving surface, the discontinuous surface being discontinuous with respect to the light receiving surface; and a scintillator layer formed with use of the light receiving surface as a crystal growth surface and configured to convert incident radiation into light.

According to an embodiment of the present technology, there is provided an imaging unit including: a radiation detector; and a drive section configured to drive the radiation detector. The radiation detector includes: a plurality of photoelectric conversion regions each configured to convert light incident on a light receiving surface into a current signal; a discontinuous surface formed around the light receiving surface, the discontinuous surface being discontinuous with respect to the light receiving surface, a plurality of conversion circuits provided in correspondence with the plurality of photoelectric conversion regions in a one-to-one relationship and each configured to convert the current signal into a voltage signal; and a scintillator layer formed with use of the light receiving surface as a crystal growth surface and configured to convert incident radiation into light.

According to an embodiment of the present technology, there is provided an imaging and display system including: an imaging unit; and a display unit configured to perform image display based on an imaging signal obtained by the imaging unit. The imaging unit includes a radiation detector, and a drive section configured to drive the radiation detector. The radiation detector includes: a plurality of photoelectric conversion regions each configured to convert light incident on a light receiving surface into a current signal; a discontinuous surface formed around the light receiving surface, the discontinuous surface being discontinuous with respect to the light receiving surface, a plurality of conversion circuits provided in correspondence with the plurality of photoelectric conversion regions in a one-to-one relationship and each configured to convert the current signal into a voltage signal; and a scintillator layer formed with use of the light receiving surface as a crystal growth surface and configured to convert incident radiation into light.

In the radiation detector, the imaging unit, and the imaging and display system according to the embodiments of the present technology, the light receiving surface of each of the photoelectric conversion regions is surrounded by the discontinuous surface, and serves as the crystal growth surface of the scintillator layer. Accordingly, the light receiving surface is in direct contact with the scintillator layer. Therefore, it is possible to achieve light reception efficiency that is higher than, for example, light reception efficiency in a case where a member only used for allowing the scintillator layer to grow thereon is provided between the light receiving surface and the scintillator layer. Moreover, the light receiving surface is surrounded by the discontinuous surface. Therefore, when the scintillator layer is formed on the light receiving surface, the crystal interface extending in the thickness direction of the scintillator layer is formed in a region opposing the discontinuous surface due to discontinuity between the light receiving surface and the discontinuous surface. Accordingly, part of light generated in the scintillator layer is reflected by the crystal interface and enters the light receiving surface. Therefore, high resolution is achieved.

According to an embodiment of the present technology, there is provided a method of manufacturing a radiation detector, the method including: (A) transferring, to a substrate, part or all of a plurality of devices included in a device substrate, the plurality of devices being fixed onto a support substrate included in the device substrate, and the plurality of devices each being configured to convert light incident on a light receiving surface into a current signal; and (B) forming a scintillator layer with use of the light receiving surface as a crystal growth surface, the scintillator layer being configured to convert incident radiation into light.

In the method of manufacturing the radiation detector according to the embodiment of the present technology, part or all of the plurality of devices fixed to the device substrate are transferred to the substrate. Also, the light receiving surface of each of the devices transferred to the substrate serves as the crystal growth surface of the scintillator layer. Accordingly, the light receiving surface is in direct contact with the scintillator layer. Therefore, it is possible to achieve light reception efficiency that is higher than, for example, light reception efficiency in a case where a member only used for allowing the scintillator layer to grow thereon is provided between the light receiving surface and the scintillator layer. Moreover, the light receiving surface of each of the devices transferred to the substrate is surrounded by the spacing formed between the devices. Therefore, when the scintillator layer is formed on the light receiving surface, the crystal interface extending in the thickness direction of the scintillator layer is formed in a region opposing the spacing formed between the devices, due to discontinuity between the light receiving surface and the spacing formed between the devices. Accordingly, part of light generated in the scintillator layer is reflected by the crystal interface and enters the light receiving surface. Therefore, high resolution is achieved.

According to an embodiment of the present technology, there is provided a radiation detector, comprising a plurality of photoelectric conversion devices, each photoelectric conversion device formed at least partially within an embedding layer and having a light receiving surface situated at least partially outside of the embedding layer, and a plurality of scintillator crystals, at least a first scintillator crystal of the plurality of scintillator crystals in contact with at least one light receiving surface at a proximal end, wherein a cross-section of the first scintillator crystal at the proximal end is smaller than a cross-section of the first scintillator crystal at a distal end.

According to an embodiment of the present technology, there is provided a method of forming a radiation detector, comprising forming a plurality of photoelectric conversion devices on a substrate, at least a first photoelectric conversion device of the plurality of photoelectric conversion devices including one or more electrodes, wherein the first photoelectric conversion device is formed such that at least one of the one or more electrodes are coupled to a circuit formed within the substrate, forming an embedding layer on the substrate such that at least a portion of the first photoelectric conversion device is embedded within the embedding layer, and forming a scintillator layer on a surface of the first photoelectric conversion layer.

According to an embodiment of the present technology, there is provided an imaging unit, comprising a radiation detector, and a drive circuit configured to drive the radiation detector, the radiation detector including a plurality of pixels, at least a first pixel of the plurality of pixels comprising a photoelectric conversion device formed at least partially within an embedding layer and having a light receiving surface situated at least partially outside of the embedding layer, and a first scintillator crystal in contact with the light receiving surface at a proximal end, wherein a cross-section of the first scintillator crystal at the proximal and is smaller than a cross-section of the first scintillator crystal at a distal end.

According to an embodiment of the present technology, there is provided an imaging and display system comprising an imaging unit, and a display unit configured to perform image display based on an imaging signal obtained by the imaging unit, the imaging unit including a radiation detector, and a drive circuit configured to drive the radiation detector, the radiation detector including a plurality of pixels, at least a first pixel of the plurality of pixels comprising a photoelectric conversion device formed at least partially within an embedding layer and having a light receiving surface situated at least partially outside of the embedding layer, and a first scintillator crystal in contact with the light receiving surface at a proximal end, wherein a cross-section of the first scintillator crystal at the proximal end is smaller than a cross-section of the first scintillator crystal at a distal end.

Advantageous Effects of Invention

According to the radiation detector, the imaging unit, and the imaging and display system of the embodiments of the present technology, the light receiving surface is in direct contact with the scintillator layer, and the light receiving surface is surrounded by the discontinuous surface. Therefore, high light reception efficiency and high resolution are achieved. Accordingly, it is possible to achieve higher image quality in an image. It is to be noted that the advantageous effect of the present technology is not necessarily limited to the effects described above, and may be any of effects described in the present description.

According to the method of manufacturing the radiation detector of the embodiment of the present technology, the light receiving surface is in direct contact with the scintillator layer, and the light receiving surface is surrounded by the spacing formed between the devices. Therefore, high light reception efficiency and high resolution are achieved. Accordingly, it is possible to achieve higher image quality in an image. It is to be noted that the advantageous effect of the present technology is not necessarily limited to the effects described above, and may be any of the effects described in the present description.

It is to be understood that both the foregoing general description and the following detailed description are exemplary, and are intended to provide further explanation of the technology as claimed.

BRIEF DESCRIPTION OF DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 1 is a diagram illustrating an example of a cross-sectional configuration of a radiation detector according to a first embodiment of the present technology.

FIG. 2 is a diagram illustrating an example of a circuit configuration in the radiation detector shown in FIG. 1.

FIG. 3 is a diagram illustrating an example of a cross-sectional configuration of a device shown in FIG. 1.

FIG. 4 is a diagram illustrating another example of the cross-sectional configuration of the device shown in FIG. 1.

FIG. 5 is a cross-sectional view for explaining an example of a process of manufacturing the radiation detector shown in FIG. 1.

FIG. 6 is a cross-sectional view for explaining a step following a step shown in FIG. 5.

FIG. 7 is a cross-sectional view for explaining a step following the step shown in FIG. 6.

FIG. 8 is a cross-sectional view for explaining a step following the step shown in FIG. 7.

FIG. 9 is a cross-sectional view for explaining a step following the step shown in FIG. 8.

FIG. 10 is a cross-sectional view for explaining a step following the step shown in FIG. 9.

FIG. 11 is a cross-sectional view for explaining a step following the step shown in FIG. 10.

FIG. 12 is a cross-sectional view for explaining a step following the step shown in FIG. 11.

FIG. 13 is a cross-sectional view illustrating a modification of the radiation detector shown in FIG. 1.

FIG. 14 is a diagram illustrating an example of a circuit configuration of a wiring substrate and a circuit substrate shown in FIG. 13.

FIG. 15 is a cross-sectional view illustrating a modification of the device shown in FIG. 3.

FIG. 16 is a cross-sectional view illustrating a modification of the device shown in FIG. 4.

FIG. 17 is a diagram illustrating an example of a cross-sectional configuration of a radiation detector according to a second embodiment of the present technology.

FIG. 18 is a diagram illustrating an example of a cross-sectional configuration of a device shown in FIG. 17.

FIG. 19 is a cross-sectional view for explaining an example of a process of manufacturing the radiation detector shown in FIG. 17.

FIG. 20 is a cross-sectional view for explaining a step following a step shown in FIG. 19.

FIG. 21 is a cross-sectional view for explaining a step following the step shown in FIG. 20.

FIG. 22 is a cross-sectional view for explaining a step following the step shown in FIG. 21.

FIG. 23 is a cross-sectional view for explaining a step following the step shown in FIG. 22.

FIG. 24 is a cross-sectional view for explaining a step following the step shown in FIG. 23.

FIG. 25 is a cross-sectional view for explaining a step following the step shown in FIG. 24.

FIG. 26 is a cross-sectional view for explaining a step following the step shown in FIG. 25.

FIG. 27 is a cross-sectional view illustrating a modification of the radiation detector that includes the device shown in FIG. 3.

FIG. 28 is a cross-sectional view illustrating a modification of the radiation detector that includes the device shown in FIG. 4.

FIG. 29 is a cross-sectional view illustrating a modification of the radiation detector shown in FIG. 17.

FIG. 30 is a cross-sectional view illustrating a modification of the radiation detector shown in FIG. 1.

FIG. 31 is a cross-sectional view illustrating a modification of the radiation detector shown in FIG. 17.

FIG. 32A is a cross-sectional view illustrating a modification of the radiation detector shown in FIG. 1.

FIG. 32B is a cross-sectional view illustrating a modification of the radiation detector shown in FIG. 1.

FIG. 32C is a cross-sectional view illustrating a modification of the radiation detector shown in FIG. 1.

FIG. 33 is a cross-sectional view illustrating a modification of the radiation detector shown in FIG. 17.

FIG. 34 is a cross-sectional view illustrating a modification of the radiation detector shown in FIG. 1.

FIG. 35 is a cross-sectional view illustrating a modification of the radiation detector shown in FIG. 17.

FIG. 36 is a diagram illustrating an example of a cross-sectional configuration of a radiation detector according to a third embodiment of the present technology.

FIG. 37 is a cross-sectional view illustrating a modification of the radiation detector shown in FIG. 1.

FIG. 38 is a cross-sectional view illustrating a modification of the radiation detector shown in FIG. 17.

FIG. 39 is a cross-sectional view illustrating a modification of the radiation detector shown in FIG. 36.

FIG. 40 is a diagram illustrating an example of a schematic configuration of an imaging unit according to a fourth embodiment of the present technology.

FIG. 41 is a diagram illustrating an example of a schematic configuration of a pixel circuit shown in FIG. 40.

FIG. 42 is a diagram illustrating an example of a schematic configuration of an imaging and display system according to a fifth embodiment of the present technology.

FIG. 43 is a diagram illustrating an example of a schematic configuration of an imaging system according to a sixth embodiment of the present technology.

DESCRIPTION OF EMBODIMENTS

Some embodiments of the present technology will be described below in detail referring to the drawings. The description will be provided in the following order.

1. First Embodiment (Radiation Detector)
   An example in which a photoelectric conversion region is provided in a chip-like device
2. Second Embodiment (Radiation Detector)
   An example in which a photoelectric conversion device and a conversion circuit are provided in a chip-like device
3. Modifications of First and Second Embodiments (Radiation Detector)
   An example in which a protective film covering the chip-like device is provided
   An example in which a protective film covering a scintillator layer is provided
   An example in which a plurality of photoelectric conversion regions are provided in a common substrate
   An example in which a plurality of photoelectric conversion regions and a plurality of conversion circuits are provided in a common substrate
   An example in which a light blocking layer is provided in a region, of a top surface of a substrate, other than a region of a light receiving surface
4. Third Embodiment (Radiation Detector)
   An example in which a plurality of radiation detectors are arranged in a matrix
5. Modification (Radiation Detector)
   An example in which the scintillator layer is omitted
6. Fourth Embodiment (Imaging Unit)
7. Fifth Embodiment (Imaging and Display System)
8. Sixth Embodiment (Imaging System)

(1. First Embodiment)

(Configuration)

First, description will be provided of a radiation detector 1 according to a first embodiment of the present technology. FIG. 1 illustrates an example of a cross-sectional configuration of the radiation detector 1 according to the present embodiment. The radiation detector 1 detects radiation such as alpha rays, beta rays, gamma rays, and X-rays. The radiation detector 1 uses an indirect conversion method. The indirect conversion method refers to a method in which radiation is converted into an optical signal, and then, the optical signal is converted into an electric signal. The radiation detector 1 may include, for example, a circuit substrate 10, a plurality of devices 20, a scintillator layer 30, and a reflection plate 40.

FIG. 2 illustrates an example of a circuit configuration of a part, in the radiation detector 1, that converts an optical signal into an electric signal. The circuit substrate 10 includes a plurality of pixel circuits 13 and various wirings for connecting the respective pixel circuits 13 and the respective devices 20 to an external circuit. The pixel circuits 13 are provided in correspondence with the devices 20 in a one-to-one relationship. The pixel circuit 13 includes a drive circuit that drives the device 20. In each of the pixel circuits 13, the drive circuit may include, for example, a switch device 13S (see FIG. 2) that is connected in series to the device 20. In other words, the switch devices 13S are allocated for the pixel circuits 13 in a one-to-one relationship. The switch device 13S controls ON and OFF of the device 20 based on a control signal supplied from outside. The switch device 13S may include, for example, a TFT. As shown in FIG. 2, the circuit substrate 10 may include, for example, a plurality of data lines 12A, a plurality of gate lines 12B, and a plurality of bias lines 12C, as various wirings. For example, each of the data lines 12A may be connected to an output terminal of each of the pixel circuits 13 (for example, the switch devices 13S) arranged side by side in a column direction, and may be a wiring that extracts a signal outputted from the pixel circuit 13 to the outside. Each of the gate lines 12B may be connected to a gate terminal of each of the pixel circuits 13 (for example, the switch devices 13S) arranged side by side in a row direction, and may be a wiring that supplies the pixel circuit 13 with a signal for driving the pixel circuit 13. Each of the bias lines 12C may be connected to an end of each of the devices 20 arranged side by side in the column direction, and may be a wiring that supplies a bias voltage to the device 20.

The pixel circuit 13 may further include, for example, a conversion circuit, an amplifier circuit, and an A-D conversion circuit. The conversion circuit converts a current signal outputted from the device 20 into a voltage signal. The amplifier circuit amplifies the voltage signal outputted from the conversion circuit. The A-D conversion circuit converts an analog signal outputted from the amplifier circuit into a digital signal. It is to be noted that the circuit substrate 10 may include a plurality of such conversion circuits, a plurality of such amplifier circuits, and a plurality of such A-D conversion circuits in a circuit different from the pixel circuit 13. When the circuit substrate 10 includes the plurality of conversion circuits in a circuit different from the pixel circuit 13, each of the conversion circuits may be provided for a plurality of devices 20. In this case, the plurality of devices 20 allocated to each conversion circuit may be formed as a single device. When the circuit substrate 10 includes the plurality of amplifier circuits in a circuit different from the pixel circuit 13, each amplifier circuit may be provided for a plurality of devices 20. When the circuit substrate 10 includes the plurality of A-D conversion circuits in a circuit different from the pixel circuit 13, each of the A-D conversion circuits may be provided for a plurality of devices 20.

The circuit substrate 10 may be configured, for example, of a support substrate 11, and a circuit layer 12 and an embedding layer 15 that are laminated in order on the support substrate 11. The support substrate 11 may be configured, for example, of an insulating substrate such as a glass substrate. The support substrate 11 may be a substrate (a light blocking layer) that has light non-transmission characteristics such as a silicon substrate. The embedding layer 15 is provided for preventing a material such as solder that is used for a later-described bump 23 from giving influence to the scintillator layer 30. At least the bumps 23 are embedded in the embedding layer 15. The embedding layer 15 may be configured, for example, of a material such as underfill resin. Examples of the underfill resin may include parylene resin, acryl-based resin, epoxy-based resin, silicone resin, and urethane-based resin. The embedding layer 15 may be a light blocking layer that includes a material having light non-transmission characteristics.

The circuit layer 12 may include, for example, the plurality of pixel circuits 13 and a plurality of pad electrodes 14. The circuit layer 12 may further include, for example, wirings that connect the respective pixel circuits 13 and the respective devices 20 to an external circuit. As shown in FIG. 2, the circuit layer 12 may include, for example, the plurality of data lines 12A, the plurality of gate lines 12B, and the plurality of bias lines 12C. The pad electrode 14 is a terminal electrode that is electrically connected to the pixel circuit 13. The pad electrode 14 is exposed to a top surface of the circuit layer 12. The pad electrode 14 is in contact with the bump 23 (which will be described later) in the device 20. One pixel circuit 13 and a plurality of pad electrodes 14 are allocated for each device 20, and may be arranged, for example, in each region that opposes the device 20. Each pad electrode 14 may include, for example, an electrically-conductive metal material such as UBM (Under Bump Metallization). The UBM may be configured, for example, of nickel (Ni), and serves as a solder diffusion suppressing layer. In the circuit layer 12, the pixel circuits 13 may be embedded, for example, in an interlayer insulating film. The interlayer insulating film may be configured, for example, of a material such as silicon oxide ($SiO_2$) and silicon oxynitride (SiON). The interlayer insulating film may serve as a light blocking layer that includes a material having light non-transmission characteristics.

The plurality of devices 20 are mounted on the common circuit substrate 10. The plurality of devices 20 may be arranged, for example, two-dimensionally on the circuit substrate 10. Each of the devices 20 may have been transferred from a device substrate 100 onto a circuit substrate 10A by a transfer technique as will be described later, for example. The devices 20 are arranged to be away from one another in a plane. Therefore, a top surface (i.e., a light receiving surface 20A) of each of the devices 20 is surrounded by a spacing that is formed between the two adjacent devices 20. A width of the spacing may be, for example, equivalent to or smaller than a lateral width of the device 20. A bottom surface of the spacing configures a top surface of the circuit substrate 10 (for example, a top surface of the embedding layer 15), and configures a discontinuous surface 15A that is discontinuous with respect to the light receiving surface 20A. Herein, the wording "discontinuous with respect to the light receiving surface 20A" does not only refer to a state that the light receiving surface 20A and the discontinuous surface 15A are not arranged in the same plane. The wording "discontinuous with respect to the light receiving surface 20A" also refers to discontinuity that achieves formation of a crystal interface 31A (which will be described later) that extends in a thickness direction of the scintillator layer 30 when the scintillator layer 30 is formed in a manufacturing process of the radiation detector.

Each device 20 may be, for example, a chip of a sub-millimeter size. It is to be noted that each device 20 may have a size larger than a sub-millimeter size. Each device 20 is a separated part that serves as a component, for example, of a unit, an electronic circuit, etc. Each device 20 is a chip-like part. Each device 20 may include, for example, a chip-like function section 21, a plurality of electrodes 22, and the bump 23. The function section 21 has a function of converting light incident on a top surface of the function section 21 into a current signal. The top surface of the function section 21 serves as the light receiving surface 20A of the device 20. The light receiving surface 20A may be, for example, a planarized surface. It is to be noted that the light receiving surface 20A may be a curved surface that has concavities and convexities. Each electrode 22 is a terminal electrode that is electrically connected to a photoelectric conversion device 120 (which will be described later) in the function section 21. Each electrode 22 is arranged on a bottom surface (i.e., a surface opposite from the light receiving surface 20A) of the function section 21. Each electrode 22 is in contact with the bump 23. Each electrode 22 may include, for example, an electrically-conductive metal material such as UBM. The bump 23 is in contact with the electrode 22 and the pad electrode 14. The bump 23 may be configured, for example, of alloy that includes lead or tin as a main component. The bump 23 may be formed, for example, by electrolytic plating, imprinting of solder paste, etc.

FIGS. 3 and 4 each illustrate an example of a cross-sectional configuration of the device 20. FIG. 3 illustrates an example of the cross-sectional configuration of the device 20 that includes the photoelectric conversion device 120 that is configured to detect light entering from the top surface of the photoelectric conversion device 120. In other words, the photoelectric conversion device 120 shown in FIG. 3 has a top-surface illumination structure. FIG. 4 illustrates an example of the cross-sectional configuration of the device 20 that includes the photoelectric conversion device 120 that is configured to detect light entering from a back surface of the photoelectric conversion device 120.

In other words, the photoelectric conversion device 120 shown in FIG. 4 has a back-surface illumination structure.
(Top-Surface Illumination Structure, FIG. 3)

As shown in FIG. 3, the device 20 may have, for example, a structure in which an insulating layer 111, an insulating layer 112, and an insulating layer 113 are laminated in order from the light receiving surface 20A. A back surface (i.e., a surface opposite from a surface on which the insulating layers 112 and 113 are laminated) of the insulating layer 111 serves as the light receiving surface 20A. The insulating layer 111 may be configured, for example, of silicone-based resin. The insulating layers 112 and 113 may each be configured, for example, also of a material such as silicone-based resin.

As shown in FIG. 3, the device 20 may further include, for example, the photoelectric conversion device 120 and an electrically-conductive path that electrically connects the photoelectric conversion device 120 to the electrode 22. The electrically-conductive path may be configured, for example, of a pad electrode 114, a wiring layer 115, a connection section 116, and a connection section 117 that are arranged in order from the photoelectric conversion device 120. The photoelectric conversion device 120 may be arranged, for example, in the insulating layer 113. The pad electrode 114, the wiring layer 115, and the connection section 116 may be arranged, for example, in the insulating layer 112. The connection section 117 may be arranged, for example, in the insulating layer 113.

The photoelectric conversion device 120 may have, for example, a structure in which a semiconductor layer including a photoelectric conversion region 122, a plurality of electrodes 123, and a plurality of bumps 124 are laminated on a substrate 121. Accordingly, one photoelectric conversion region 122 is formed in each device 20. The device 20 includes a semiconductor layer that includes the photoelectric conversion region 122 and the insulating layer 111 that is arranged above this semiconductor layer. In the photoelectric conversion device 120, the semiconductor layer including the photoelectric conversion region 122 is arranged in a position closer to the light receiving surface 20A, and the substrate 121 is arranged in a position closer to the bottom surface of the device 20. Each electrode 123 is electrically connected to the photoelectric conversion region 122. Each bump 124 is arranged in contact with the electrode 123 and with the pad electrode 114. The pad electrode 114 and the connection section 116 are arranged in contact with the wiring layer 115. The connection section 117 is arranged in contact with the connection section 116 and with the electrode 22.

The substrate 121 is configured of a semiconductor substrate. The photoelectric conversion region 122 is formed in the semiconductor layer that is formed on the substrate 121. The photoelectric conversion region 122 may be configured, for example, of a p-type semiconductor layer, an i-type semiconductor layer, and an n-type semiconductor layer that are laminated in order. The photoelectric conversion region 122 (the semiconductor layer including the photoelectric conversion region 122) may be configured, for example, of crystalline silicon or amorphous silicon. The electrode 123, the bump 124, the pad electrode 114, the wiring layer 115, the connection section 116, and the connection section 117 are each configured of an electrically-conductive metal material.

(Back-Surface Illumination Structure, FIG. 4)

As shown in FIG. 4, the device 20 may have, for example, a structure in which a semiconductor layer including the photoelectric conversion region 122, the plurality of electrodes 22, and the plurality of bumps 23 are laminated on the substrate 121. In the device 20, the semiconductor layer including the photoelectric conversion region 122 is arranged in a position closer to the light receiving surface 20A, and the substrate 121 is arranged in a position closer to the bottom surface of the device 20. A back surface (a surface opposite from a surface on which the semiconductor layer including the photoelectric conversion region 122 is laminated) of the substrate 121 serves as the light receiving surface 20A.

The scintillator layer 30 converts a wavelength of radiation incident on the light receiving surface 20A into a wavelength in a range of sensitivity of the photoelectric conversion region 122. Specifically, the scintillator layer 30 converts the radiation incident on the light receiving surface 20A into light. The scintillator layer 30 may be configured, for example, of a fluorescent material that converts radiation such as alpha rays, beta rays, gamma rays, and X-rays into visible light. Examples of such a fluorescent material may include a material obtained by adding thallium (Tl) or sodium (Na) to cesium iodide (CsI) and a material obtained by adding thallium (Tl) to sodium iodide (NaI). Examples of the above-mentioned fluorescent material may include a material obtained by adding europium (Eu) to cesium bromide (CsBr) and a material obtained by adding europium (Eu) to cesium fluorobromide (CsBrF).

The scintillator layer 30 is formed with the use of the light receiving surface 20A as a crystal growth surface. The scintillator layer 30 may be formed, for example, by film formation by a vacuum deposition method. The scintillator layer 30 has the crystal interface 31A that extends in the thickness direction of the scintillator layer 30, in a region opposing the discontinuous surface 15. The crystal interface 31A extends from an end of the light receiving surface 20A in the thickness direction of the scintillator layer 30, and thereby, sections the scintillator layer 30 in correspondence with each of the devices 20 (or each of the photoelectric conversion regions 122). Therefore, the scintillator layer 30 includes a plurality of scintillator sections 31 that are each allocated to each of the devices 20 (or each of the photoelectric conversion regions 122) by the crystal interface 31A.

The cross-sectional area of the scintillator section 31 in a position closer to the reflection plate 40 is larger than a cross-sectional area of the scintillator section 31 in a position closer to the light receiving surface 20A. It is to be noted that the above-mentioned cross-sectional area refers to the area of a cross-section, of the scintillator section 31, that is parallel to the light receiving surface 20A. Therefore, a width d of a spacing between the two adjacent scintillator sections 31 is decreased from the discontinuous surface 15A side to the reflection plate 40 side (the upper side of the scintillator section 31). As shown in FIG. 1, the crystal interface 31A may be, for example, a concave-like curved surface when viewed from the discontinuous surface 15A side. An angle theta 1, at the end of the light receiving surface 20A, that is formed by the crystal interface 31A and the light receiving surface 20A is an obtuse angle. An angle theta 2 formed by a tangent plane 30S of the crystal interface 31A and the light receiving surface 20A is 90 degrees or larger. The angle theta 2 decreases as a tangent point of the tangent plane 30S is farther from the light receiving surface 20A side and is closer to the reflection plate 40 side (the upper side of the scintillator section 31). Therefore, part of light that is generated in the scintillator section 31 and travels toward the light receiving surface 20A is reflected by the crystal interface 31A and is allowed to enter the light receiving surface 20A. In other words, the scintillator section 31 serves as a light condensing lens. An air spacing is formed between the adjacent crystal interfaces 31A. It is to be noted that a scintillator section formed with the use of the discontinuous surface 15A as a crystal growth surface may be provided between the adjacent crystal interfaces 31A. In this case, a side surface of the scintillator section that is formed with the use of the discontinuous surface 15A as the crystal growth surface configures a crystal interface, and is arranged to oppose the side surface of the device 20 and the crystal interface 31A with a predetermined spacing in between.

The reflection plate 40 has a role of returning, toward the device 20, the light that is emitted from the scintillator layer 30 in a direction opposite from the device 20. The reflection plate 40 may be configured of a moisture non-transmission material that substantially does not transmit moisture. In such a case, it is possible to prevent moisture from entering into the scintillator layer 30 with the use of the reflection plate 40. The reflection plate 40 may be configured, for example, of thin-plate glass. The reflection plate 40 may be omitted. A reflection structure provided on the scintillator layer 30 may be a configuration other than the reflection plate 40 described above, and may be configured, for example, of a deposited film made of Al.

(Manufacturing Method)

Next, description will be provided of an example of a method of manufacturing the radiation detector 1. FIGS. 5 to 12 illustrate a process of manufacturing the radiation detector 1 in order of steps. First, the device substrate 100 and the circuit substrate 10A are prepared (FIGS. 5 and 6).

As shown in FIG. 5, the device substrate 100 may include, for example, a support substrate 101, a fixing layer 102, and a plurality of devices 20. Each of the devices 20 is arranged on the support substrate 101 so that the electrodes 22 are positioned on the upper side. The support substrate 101 supports the plurality of devices 20. The support substrate 101 may be configured, for example, of a glass substrate, a resin substrate, etc. The fixing layer 102 fixes each device 20 onto the support substrate 101 and allows each device 20 to be peeled off from the support substrate 101 at the time of transferring process. When the transferring process is performed by laser ablation, the fixing layer 102 may be configured, for example, of a material that absorbs light in a laser oscillation wavelength range. The fixing layer 102 may be formed, for example, on an entire top surface of the support substrate 101. As shown in FIG. 5, the fixing layer 102 may be formed, for example, only in the spacing between the support substrate 101 and each device 20. Taking into consideration transfer properties, the fixing layer 102 may be preferably formed for each device 20 as shown in FIG. 5. Taking into consideration simplicity of the process, the fixing layer 102 may be preferably formed on the entire top surface of the support substrate 101. The fixing layer 102 may be in direct contact with the support substrate 101. It is to be noted that a layer such as an adhesion layer, an insulating layer, and a metal layer may be inserted between the fixing layer 102 and the support substrate 101. The circuit substrate 10A has a configuration similar to the configuration of the circuit substrate 10 described above except for that the embedding layer 15 is omitted. Therefore, the pad electrodes 14 are exposed to the top surface of the circuit substrate 10A.

Next, a fixing layer 103 is formed on the entire top surface of the circuit substrate 10A (FIG. 7). The fixing layer 103 accepts the respective devices 20 at the time of the transferring process, and holds one or a plurality of transferred devices 20 by adhesion. The fixing layer 103 is configured of liquid or gel having viscosity, and may be configured, for example, of flux. The flux is mainly configured of resin and solvent. The flux is a so-called solder flux, and is liquid or a paste-like material that has a function of reducing oxide on a surface of metal, or liquid or a paste-like material to which an activator is added in order to achieve a reduction function. Such an activator is a material that has reduction properties such as molten salt or acid. Examples of such molten salt may include halides such as chlorides and fluorides. Examples of such acid may include orthophosphoric acid, organic acid, amines, and hydrohalic acid amine salt. Other additive may be added to the flux as necessary. The flux is applied onto the entire top surface of the circuit substrate 10A with a thin and uniform thickness by a method such as rotation coating, a spraying method, a doctor blade method, printing, a transferring method, and an imprinting method. Therefore, in this process, the flux has low viscosity level that is suitable for coating. It is to be noted that a process for increasing the viscosity level of the fixing layer 103 on the circuit substrate 10A may be performed before performing the transferring process which will be described later.

Next, part or all of the plurality of devices 20 on the device substrate 100 are transferred to the circuit substrate 10A. First, the device substrate 100 and the circuit substrate 10A are set in a transfer apparatus. Subsequently, the device substrate 100 and the circuit substrate 10A are arranged to oppose each other with a predetermined air spacing 104 in between (in other words, being away from each other) as shown in FIG. 8, or being closely attached to each other as shown in FIG. 9. Subsequently, one or a plurality of devices 20 out of the plurality of devices 20 on the device substrate 100 are transferred to the circuit substrate 10A, for example, by laser ablation (FIG. 10). Thus, the transferred one or plurality of devices 20 are temporarily fixed to the circuit substrate 10A with the use of the fixing layer 103. At this time, a discontinuous surface 103A that is discontinuous with respect to the light receiving surface 20A is formed between two devices 20, out of the plurality of devices 20, that have become adjacent to each other due to the transferring process to the circuit substrate 10A. It is to be noted that the transferring process may be performed by a method other than laser ablation.

At the time of the transferring process, the bump 23 sticks into the fixing layer 103, and serves as an anchor. At this time, a thickness of the bump 23 (more precisely, a distance between the bottom surface of the function section 21 and a tip end of the bump 23) may be larger or smaller than a thickness of the fixing layer 103. After the transferring process, part or whole of the electrode 22 opposes the pad electrode 14 with the bump 23 in between. It is to be noted that it is enough that the area of a portion, of the electrode 22, that opposes the pad electrode 14 is about a half of the area of the electrode 22 when viewed from a direction of a normal to a mounting surface of the circuit substrate 10A. Therefore, this transferring process is allowed to be performed with accuracy that merely achieves such a state. It is to be noted that, in a case where it is necessary to prevent movement of each of the transferred devices 20 until a later-described reflow process is performed or during the reflow process, a process to increase the viscosity level of the fixing layer 103 on the circuit substrate 10A may be performed before performing the later-described reflow process.

Next, a reflow process is performed on the circuit substrate 10A (FIG. 11). In this process, the bump 23 is molten or softened. Therefore, the electrode 22 opposes the pad electrode 14, or exactly opposes the pad electrode 14 due to a self-alignment function of the bump 23. Also, due to molten or softened bump 23, the transferred device 20 (or the transferred electrode 22) is electrically connected to the circuit substrate 10A (or the pad electrode 14). In other words, the transferred device 20 (or the transferred electrode 22) is electrically connected to the circuit substrate 10A (or the pad electrode 14) via an electrically-conductive protrusion (the bump 23). After the reflow process, the bump 23 is solidified, and thereby, each device 20 is fixed in a predetermined position on the circuit substrate 10A with high accuracy.

Subsequently, the fixing layer 103 is removed (washed). In this process, it is enough that the flux used as the fixing layer 103 is dissolved and residual substances are eliminated. A washing agent suitable for the flux may be used. At this time, a substance (such as dust) attached to the mounting surface of the circuit substrate 10A such as a residual substances generated by laser ablation is allowed to be removed while washing the flux. It is to be noted that, when the flux is of a non-washing type, the process of removing the fixing layer 103 may be omitted.

Subsequently, the embedding layer 15 that covers at least the bump 23 is formed (see FIG. 12). Accordingly, the circuit substrate 10 is formed. At this time, the discontinuous surface 15A that is discontinuous with respect to the light receiving surface 20A is formed between the two adjacent devices 20. Subsequently, the scintillator layer 30 is formed with the use of the light receiving surface 20A as a crystal growth surface, for example, by forming a film by a vacuum deposition method (FIG. 12).

At the time of forming the scintillator layer 30, the crystal interface 31A that extends in the thickness direction of the scintillator layer 30 is formed in a region opposing the discontinuous surface 15A. Also, a plurality of scintillator sections 31 are formed that are each allocated to each device 20 by the crystal interface 31A (FIG. 12). At last, the reflection plate 40 is formed on the scintillator layer 30. Thus, the radiation detector 1 is manufactured.

(Effects)

Next, description will be provided of effects of the radiation detector 1. In the radiation detector 1, the light receiving surface 20A of each device 20 is surrounded by the discontinuous surface 15A, and serves as the crystal growth surface of the scintillator layer 30. Accordingly, the light receiving surface 20A is in direct contact with the scintillator layer 30. Therefore, it is possible to achieve light reception efficiency that is higher, for example, than light reception efficiency in a case where a member only used for allowing the scintillator layer 30 to grow thereon is provided between the light receiving surface 20A and the scintillator layer 30. Moreover, the light receiving surface 20A is surrounded by the discontinuous surface 15A. Therefore, when the scintillator layer 30 is formed on the light receiving surface 20A, the crystal interface 31A that extends in the thickness direction of the scintillator layer 30 is formed in a region opposing the discontinuous surface 15A, due to discontinuity between the light receiving surface 20A and the discontinuous surface 15A. Accordingly, part of light generated in the scintillator layer 30 is reflected by the crystal interface 31A and enters the light receiving surface 20A. Therefore, high resolution is achieved. Accordingly, it is possible to achieve higher image quality in an image.

Moreover, in the radiation detector 1, the respective devices 20 are arranged on the circuit substrate 10. The various wirings in the circuit substrate 10 are therefore allowed to be formed also directly below the respective devices 20. This allows a width of each of the various wirings in the circuit substrate 10 to be larger, compared to that in the case where the respective devices 20 are formed in the circuit substrate 10. Accordingly, wiring resistance is decreased by allowing the widths of the various wirings in the circuit substrate 10 to be larger, and Johnson noise is therefore decreased.

Moreover, in the radiation detector 1, in the case where the photoelectric conversion region 122 is configured of crystalline silicon, an afterimage included in an image obtained by the radiation detector 1 is reduced compared to in the case where the photoelectric conversion region 122 is configured of amorphous silicon.

(2. Modifications of First Embodiment)

(Modification 1)

In the above embodiment, the case has been described as an example in which the plurality of pixel circuits 13 are arranged at positions opposing the respective devices 20 in a one-to-one relationship. However, for example, as shown in FIGS. 13 and 14, the radiation detector 1 may include, instead of the circuit substrate 10, a wiring substrate 90 that supports the respective devices 20, and may further include a circuit substrate 95 at a peripheral edge of the wiring substrate 90 (specifically, outside the radiation application region).

The wiring substrate 90 is a substrate that includes the plurality of switch devices 13S and the plurality of wirings (for example, the data lines 12A, the gate lines 12B, and the bias lines 12C). The plurality of switch devices 13 are each connected in series to the device 20. The plurality of wirings are connected to the respective switch devices 13S and the respective devices 20. Specifically, the wiring substrate 90 may have, for example, a configuration in which a wiring layer 92 and an embedding layer 94 are laminated in order on a support substrate 91. The support substrate 91 may be, for example, an insulating substrate such as a glass substrate or a resin substrate. The embedding layer 94 is a layer for preventing a solder or the like used as the material of the bump 23 from acting on the scintillator layer 30. At least the bump 23 is embedded in the embedding layer 94. The embedding layer 94 may be configured, for example, of underfill resin or the like. The embedding layer 94 may be configured as a light blocking layer that includes a light non-transmissive material.

The wiring layer 92 may include, for example, a plurality of pad electrodes 93, and wirings (for example, the data lines 12A, the gate lines 12B, and the bias lines 12C) that connects the respective devices 20 to the circuit substrate 95. The pad electrode 93 is a terminal electrode that is electrically connected to the wirings in the wiring layer 92, and is exposed to a top surface of the wiring layer 92. The pad electrode 93 is in contact with the bump 23 in the device 20. The plurality of pad electrodes 93 are allocated for the respective devices 20. For example, the plurality of pad electrodes 93 may be each arranged for each of regions opposing the respective devices 20. Each of the pad electrodes 93 may include, for example, an electrically-conductive metal material such as UBM. The wirings in the wiring layer 92 are embedded in, for example, an interlayer insulating film or the like. The interlayer insulating film may be configured, for example, of silicon oxide (SiO2), silicon oxynitride (SiON), or the like. The interlayer insulating film may be configured as a light blocking layer that includes a light non-transmissive material.

The plurality of devices 20 are mounted on the common wiring substrate 90. The plurality of devices 20 may be, for example, arranged two-dimensionally on the wiring substrate 90. Each of the devices 20 may have been transferred from a device substrate 200 onto the wiring substrate 90 by a transfer technique, for example. The devices 20 are arranged to be away from one another in a plane. Therefore, a top surface (i.e., a light receiving surface 20A) of each of the devices 20 is surrounded by a spacing that is formed between the two adjacent devices 20. A width of the spacing may be, for example, equivalent to or smaller than a lateral width of the device 20. A bottom surface of the spacing configures a top surface of the wiring substrate 90 (for example, a top surface of the embedding layer 94), and configures a discontinuous surface 94A that is discontinuous with respect to the light receiving surface 20A. In other words, the discontinuous surface 94A is a bottom surface of the spacing between the two adjacent devices 20. Herein, the wording "discontinuous with respect to the light receiving surface 20A" does not only refer to a state that the light receiving surface 20A and the discontinuous surface 94A are not arranged in the same plane. The wording "discontinuous with respect to the light receiving surface 20A" also refers to discontinuity that achieves formation of a crystal interface 31A that extends in the thickness direction of the scintillator layer 30 when the scintillator layer 30 is formed in a manufacturing process of the radiation detector.

The circuit substrate 95 processes a signal outputted from the device 20. As shown in FIG. 14, the circuit substrate 95 may include an output circuit IC 95B on a FPC (Flexible Printed Circuit) 95A. The output circuit IC 95B may include, for example, a conversion circuit 95B1 that converts a current signal outputted from the device 20 into a voltage signal, and an amplifier circuit 95B2 that amplifies the voltage signal outputted from the conversion circuit 95B1, for each pixel column. The output circuit IC 95B may further include, for example, an A-D conversion circuit that converts an analog signal outputted from the amplifier into a digital signal. One A-D conversion circuit may be provided, for example, for all of the pixel columns.

In the present modification, the plurality of switch devices 13S, the plurality of data lines 12A, etc. are provided in the radiation application region, and the circuit (the circuit substrate 95) that processes the signal outputted from the device 20 is provided outside the radiation application region. This allows the circuit substrate 95 to be less exposed to radiation, which improves tolerance of the radiation detector 1 to radiation.

(Modification 2)

In the above-described modification, the plurality of switch devices 13S may be provided in correspondence with the devices 20 in a one-to-one relationship, instead of the wiring substrate 90. For example, as shown in FIGS. 15 and 16, each of the switch devices 13S is provided in a semiconductor layer in which the photoelectric conversion region 122 is formed, in each of the devices 20. In this case, the photoelectric conversion region 122 and the switch device 13S (that is, the semiconductor layer including the photoelectric conversion region 122 and the switch device 13S) may be preferably configured of crystalline silicon. In such a case, improvement in switching speed of the switch device 13S is achieved, in addition to reduction of the afterimage included in the image obtained by the radiation detector 1.

(2. Second Embodiment)

(Configuration)

Next, description will be provided of a radiation detector 2 according to a second embodiment of the present technology. FIG. 17 illustrates an example of a cross-sectional configuration of the radiation detector 2 according to the present embodiment. The radiation detector 2 detects radiation such as alpha rays, beta rays, gamma rays, and X-rays. The radiation detector 2 uses an indirect conversion method. The radiation detector 2 may include, for example, a wiring substrate 50, a plurality of devices 60, a scintillator layer 30, and a reflection plate 40.

The wiring substrate 50 includes various wirings for connecting each device 60 to an external circuit. The wiring substrate 50 may be configured, for example, of a support substrate 51, and a wiring layer 52 and an embedding layer 54 that are laminated in order on the support substrate 51. The support substrate 51 may be configured, for example, of an insulating substrate such as a glass substrate and a resin substrate. The support substrate 51 may be a substrate (a light blocking layer) that has light non-transmission characteristics such as a silicon substrate. The embedding layer 54 is provided for preventing a material such as solder that is used for a later-described bump 63 from giving influence to the scintillator layer 30. At least the bump 63 is embedded in the embedding layer 54. The embedding layer 54 may be configured, for example, of a material such as underfill resin. The embedding layer 54 may be a light blocking layer that includes a material having light non-transmission characteristics.

The wiring layer 52 may include, for example, a plurality of pad electrodes 53, and a wiring connecting the respective pad electrodes 53 to an external circuit. The pad electrode 53 is a terminal electrode that is electrically connected to the wiring in the wiring layer 52. The pad electrode 53 is exposed to a top surface of the wiring layer 52. The pad electrode 53 is in contact with the bump 63 in the device 60. A plurality of pad electrodes 53 are allocated for each device 60, and may be arranged, for example, in each region that opposes the device 60. Each pad electrode 53 may include, for example, an electrically-conductive metal material such as UBM. The wiring in the wiring layer 52 may be embedded, for example, in an interlayer insulating film. The interlayer insulating film may be configured, for example, of a material such as silicon oxide (SiO2) and silicon oxynitride (SiON). The interlayer insulating film may serve as a light blocking layer that includes a material having light non-transmission characteristics.

The plurality of devices 60 are mounted on the common wiring substrate 50. The plurality of devices 60 may be arranged, for example, two-dimensionally on the wiring substrate 50. Each of the devices 60 may have been transferred from a device substrate 200 onto the wiring substrate 50 by a transfer technique as will be described later, for example. The devices 60 are arranged to be away from one another in a plane. Therefore, a top surface (i.e., a light receiving surface 60A) of each of the devices 60 is surrounded by a spacing that is formed between the two adjacent devices 60. A width of the spacing may be, for example, equivalent to or smaller than a lateral width of the device 60. A bottom surface of the spacing configures a top surface of the wiring substrate 50 (for example, a top surface of the embedding layer 54), and configures a discontinuous surface 54A that is discontinuous with respect to the light receiving surface 60A. Accordingly, the discontinuous surface 54A is a bottom surface of the spacing between two adjacent devices 60. Herein, the wording "discontinuous with respect to the light receiving surface 60A" does not only refer to a state that the light receiving surface 60A and the discontinuous surface 54A are not arranged in the same plane. The wording "discontinuous with respect to the light receiving surface 60A" also refers to discontinuity that achieves formation of a crystal interface 31A that extends in the thickness direction of the scintillator layer 30 when the scintillator layer 30 is formed in a manufacturing process of the radiation detector.

Each device 60 may be, for example, a chip of a sub-millimeter size. It is to be noted that each device 60 may have a size larger than a sub-millimeter size. Each device 60 is a separated part that serves as a component, for example, of a unit, an electronic circuit, etc. Each device 60 is a chip-like part. Each device 60 may include, for example, a chip-like function section 61, a plurality of electrodes 62, and the bump 63. The function section 61 has a function of converting light incident on a top surface of the function section 61 into a current signal. The top surface of the function section 61 serves as the light receiving surface 60A of the device 60. The light receiving surface 60A may be, for example, a planarized surface. It is to be noted that the light receiving surface 60A may be a curved surface that has concavities and convexities. The function section 61 may further have a function of converting the current signal into a voltage signal.

Each electrode 62 is a terminal electrode that is electrically connected to a photoelectric conversion device 120 in the function section 61 and to a pixel circuit IC 160 (which will be described later). Each electrode 62 is arranged on a bottom surface (i.e., a surface opposite from the light receiving surface 60A) of the function section 61. Each electrode 62 is in contact with the bump 63. Each electrode 62 may include, for example, an electrically-conductive metal material such as UBM. The bump 63 is in contact with the electrode 62 and the pad electrode 53. The bump 63 may be configured, for example, of alloy that includes lead or tin as a main component. The bump 63 may be formed, for example, by electrolytic plating, imprinting of solder paste, etc.

FIG. 18 illustrates an example of a cross-sectional configuration of the device 60. FIG. 18 illustrates an example of the cross-sectional configuration of the device 60 that includes the photoelectric conversion device 120 that is configured to detect light entering from the top surface of the photoelectric conversion device 120. In other words, the photoelectric conversion device 120 shown in FIG. 18 has a top-surface illumination structure.

As shown in FIG. 18, the device 60 may have, for example, a structure in which an insulating layer 111, an insulating layer 112, an insulating layer 113, an insulating layer 151, and an insulating layer 152 may be laminated in order from the light receiving surface 60A. A back face (i.e., a surface opposite from a surface on which the insulating layers 112, 113, 151, and 152 are laminated) of the insulating layer 111 serves as the light receiving surface 60A. The insulating layers 151 and 152 may each be configured, for example, of silicon oxide (SiO2) and silicon oxynitride (SiON).

As shown in FIG. 18, the device 60 may further include, for example, the photoelectric conversion device 120, the pixel circuit IC 160, and an electrically-conductive path that electrically connects the photoelectric conversion device 120 and the pixel circuit IC 160 to the electrode 62. The electrically-conductive path may include a first path that may be configured, for example, of a pad electrode 114, a wiring layer 115, a connection section 116, a connection section 117, a wiring layer 154, and a connection section 155 that are arranged in order from the photoelectric conversion device 120. The electrically-conductive path may further include a second path that may be configured of a pad electrode 153, the wiring layer 154, and the connection section 155 that are arranged in order from the pixel circuit IC 160. The pixel circuit IC 160 may be arranged, for example, in the insulating layers 151 and 152. The pad electrode 153, the wiring layer 154, and the connection section 155 may be arranged, for example, in the insulating layers 151 and 152.

One pixel circuit IC 160 is provided for each photoelectric conversion region 122. The pixel circuit IC 160 is arranged in the device 60. Accordingly, one pixel circuit IC 160 is formed in each device 60. The pixel circuit IC 160 is arranged in a position, in the device 60, that opposes the photoelectric conversion region 122 (or the photoelectric conversion device 120), and is arranged below (i.e., in a position closer to the bottom surface of the device 60) the photoelectric conversion region 122 (or the photoelectric conversion device 120). The pixel circuit IC 160 may include, for example, a pixel circuit section 161, a plurality of electrodes 162, and a plurality of bumps 163. The pixel circuit section 161 may include, for example, a drive circuit that drives the photoelectric conversion device 120, and a conversion circuit that converts a current signal outputted from the photoelectric conversion device 120 into a voltage signal. The pixel circuit section 161 may further include, for example, a circuit such as an amplifier circuit that amplifies the voltage signal, and an A-D conversion circuit that converts an analog signal outputted from the amplifier circuit into a digital signal. It is to be noted that the amplifier circuit and the A-D conversion circuit may be formed not in the pixel circuit section 161 but in the wiring substrate 50. One conversion circuit may be provided in correspondence with a plurality of photoelectric conversion regions 122. In this case, the plurality of photoelectric conversion regions 122 allocated to each conversion circuit may be formed in the same device. However, in this case, the light receiving surface 60A may be preferably formed for each of the photoelectric conversion regions 122 in the top surface of the device including the plurality of photoelectric conversion regions 122. Also, a discontinuous surface that is discontinuous with respect to the light receiving surface 60A may be preferably formed in the spacing between the two adjacent light receiving surfaces 60A. Each electrode 162 is electrically connected to the pixel circuit section 161. Each bump 163 is arranged in contact with the electrode 162 and the pad electrode 153. The pad electrode 153 is arranged in contact with the wiring layer 154. The connection section 155 is arranged in contact with the wiring layer 154 and with the electrode 62. The electrode 162, the bump 163, the pad electrode 153, the wiring layer 154, and the connection section 155 may be configured of an electrically-conductive metal material.

The scintillator layer 30 converts a wavelength of radiation incident on the light receiving surface 60A into a wavelength in a range of sensitivity of the photoelectric conversion region 122. Specifically, the scintillator layer 30 converts the radiation incident on the light receiving surface 60A into light. The scintillator layer 30 is formed with the use of the light receiving surface 60A as a crystal growth surface. The scintillator layer 30 may be formed, for example, by film formation by a vacuum deposition method. The scintillator layer 30 has the crystal interface 31A that extends in the thickness direction of the scintillator layer 30, in a region opposing the discontinuous surface 54A. The crystal interface 31A extends from an end of the light receiving surface 60A in the thickness direction of the scintillator layer 30, and thereby, sections the scintillator layer 30 in correspondence with each of the devices 60 (or each of the photoelectric conversion regions 122). Therefore, the scintillator layer 30 includes a plurality of scintillator sections 31 that are each allocated for each of the devices 60 (or each of the photoelectric conversion regions 122) by the crystal interface 31A.

An angle theta 1 that is formed by the crystal interface 31A and the light receiving surface 60A is an obtuse angle. Therefore, light that is generated in the scintillator section 31 is reflected by the crystal interface 31A and is allowed to enter the light receiving surface 60A. In other words, the scintillator section 31 serves as a light condensing lens. An air spacing is formed between the adjacent crystal interfaces 31A. It is to be noted that a scintillator section formed with the use of the discontinuous surface 54A as a crystal growth surface may be provided between the adjacent crystal interfaces 31A. In this case, a side surface of the scintillator section that is formed with the use of the discontinuous surface 54A as the crystal growth surface configures a crystal interface, and is arranged to oppose the side surface of the device 60 and the crystal interface 31A with a predetermined spacing in between.

(Manufacturing Method)

Next, description will be provided of an example of a method of manufacturing the radiation detector 2. FIGS. 19 to 26 illustrate a process of manufacturing the radiation detector 2 in order of steps. First, the device substrate 200 and the wiring substrate 50A are prepared (FIGS. 19 and 20).

As shown in FIG. 19, the device substrate 200 may include, for example, a support substrate 201, a fixing layer 202, and a plurality of devices 60. Each of the devices 60 is arranged on the support substrate 201 so that the electrodes 62 are positioned on the upper side. The support substrate 201 supports the plurality of devices 60. The support substrate 201 may be configured, for example, of a silicon substrate, a glass substrate, a resin substrate, etc. The fixing layer 202 fixes each device 60 onto the support substrate 201 and allows each device 60 to be peeled off from the support substrate 201 at the time of transferring process. When the transferring process is performed by laser ablation, the fixing layer 202 may be configured, for example, of a material that absorbs light in a laser oscillation wavelength range. The fixing layer 202 may be formed, for example, on an entire top surface of the support surface 201. As shown in FIG. 19, the fixing layer 202 may be formed, for example, only in the spacing between the support substrate 201 and each device 60. Taking into consideration transfer properties, the fixing layer 202 may be preferably formed for each device 60 as shown in FIG. 19. Taking into consideration simplicity of the process, the fixing layer 202 may be preferably formed on the entire top surface of the support substrate 201. The fixing layer 202 may be in direct contact with the support substrate 201. It is to be noted that a layer such as an adhesion layer, an insulating layer, and a metal layer may be inserted between the fixing layer 202 and the support substrate 201. The wiring substrate 50A has a configuration similar to the configuration of the wiring substrate 50 described above except for that the embedding layer 54 is omitted. Therefore, the pad electrodes 53 are exposed to the top surface of the wiring substrate 50A.

Next, a fixing layer 203 is formed on the top surface as a whole of the wiring substrate 50A (FIG. 21). The fixing layer 203 accepts the respective devices 60 at the time of the transferring process, and holds one or a plurality of transferred devices 60 by adhesion. The fixing layer 203 is configured of liquid or gel having viscosity, and may be configured, for example, of flux mentioned as an example in the above embodiment. The flux is applied onto the entire top surface of the wiring substrate 50A with a thin and uniform thickness by a method such as rotation coating, a spraying method, a doctor blade method, printing, a transferring method, and an imprinting method. Therefore, in this process, the flux has low viscosity level that is suitable for coating. It is to be noted that a process for increasing the viscosity level of the fixing layer 203 on the wiring substrate 50A may be performed before performing the transferring process which will be described later.

Next, part or all of the plurality of devices 60 on the device substrate 200 are transferred to the wiring substrate 50A. First, the device substrate 200 and the wiring substrate 50A are set in a transfer apparatus. Subsequently, the device substrate 200 and the wiring substrate 50A are arranged to oppose each other with a predetermined air spacing 204 in between (in other words, being away from each other) as shown in FIG. 22, or being closely attached to each other as shown in FIG. 23. Subsequently, one or a plurality of devices 60 out of the plurality of devices 60 on the device substrate 200 are transferred to the wiring substrate 50A, for example, by laser ablation (FIG. 24). Thus, the transferred devices 60 are temporarily fixed to the wiring substrate 50A with the use of the fixing layer 203. At this time, a discontinuous surface 203A that is discontinuous with respect to the light receiving surface 60A is formed between two devices 60, out of the plurality of devices 60, that have become adjacent to each other due to the transferring process to the wiring substrate 50A. It is to be noted that the transferring process may be performed by a method other than laser ablation.

At the time of the transferring process, the bump 63 sticks into the fixing layer 203, and serves as an anchor. At this time, a thickness of the bump 63 (more precisely, a distance between the bottom surface of the function section 61 and a tip end of the bump 63) may be larger or smaller than a thickness of the fixing layer 203. After the transferring process, part or whole of the electrode 62 opposes the pad electrode 53 with the bump 63 in between. It is to be noted that it is enough that the area of a portion, of the electrode 62, that opposes the pad electrode 53 is about a half of the area of the electrode 62 when viewed from a direction of a normal to a mounting surface of the wiring substrate 50A. Therefore, this transferring process is allowed to be performed with accuracy that merely achieves such a state. It is to be noted that, in a case where it is necessary to prevent movement of each of the transferred devices 60 until a later-described reflow process is performed or during the reflow process, a process to increase the viscosity level of the fixing layer 203 on the wiring substrate 50A may be performed before performing the later-described reflow process.

Next, a reflow process is performed on the wiring substrate 50A (FIG. 25). In this process, the bump 63 is molten or softened. Therefore, the electrode 62 opposes the pad electrode 53, or exactly opposes the pad electrode 53 due to a self-alignment function of the bump 63. Also, due to molten or softened bump 63, the transferred device 60 (or the transferred electrode 62) is electrically connected to the wiring substrate 50A (or the pad electrode 53). In other words, the transferred device 60 (or the transferred electrode 62) is electrically connected to the wiring substrate 50A (or the pad electrode 53) via an electrically-conductive protrusion (the bump 63). After the reflow process, the bump 63 is solidified, and thereby, each device 60 is fixed in a predetermined position on the wiring substrate 50A with high accuracy.

Subsequently, the fixing layer 203 is removed (washed). In this process, it is enough that the flux used as the fixing layer 203 is dissolved and residual substances are eliminated. A washing agent suitable for the flux may be used. At this time, substances (such as dust) attached to the mounting surface of the wiring substrate 50A such as residual substances generated by laser ablation is allowed to be removed while washing the flux. It is to be noted that, when the flux is of a non-washing type, the process of removing the fixing layer 203 may be omitted.

Subsequently, the embedding layer 54 that covers at least the bump 63 is formed (see FIG. 26). Accordingly, the wiring substrate 50 is formed. At this time, the discontinuous surface 54A that is discontinuous with respect to the light receiving surface 60A is formed between the two adjacent devices 60. Subsequently, the scintillator layer 30 is formed with the use of the light receiving surface 60A as a crystal growth surface, for example, by forming a film by a vacuum deposition method (FIG. 26). At the time of forming the scintillator layer 30, the crystal interface 31A that extends in the thickness direction of the scintillator layer 30 is formed in a region opposing the discontinuous surface 54A. Also, a plurality of scintillator sections 31 are formed that are each allocated to each device 60 by the crystal interface 31A (FIG. 26). At last, the reflection plate 40 is formed on the scintillator layer 30. Thus, the radiation detector 2 is manufactured.

(Effects)

Next, description will be provided of effects of the radiation detector 2. In the radiation detector 2, the light receiving surface 60A of each device 60 is surrounded by the discontinuous surface 54A, and serves as the crystal growth surface of the scintillator layer 30. Accordingly, the light receiving surface 60A is in direct contact with the scintillator layer 30. Therefore, it is possible to achieve light reception efficiency that is higher, for example, than light reception efficiency in a case where a member only used for allowing the scintillator layer 30 to grow thereon is provided between the light receiving surface 60A and the scintillator layer 30. Moreover, the light receiving surface 60A is surrounded by the discontinuous surface 54A. Therefore, when the scintillator layer 30 is formed on the light receiving surface 60A, the crystal interface 31A that extends in the thickness direction of the scintillator layer 30 is formed in a region opposing the discontinuous surface 54A due to discontinuity between the light receiving surface 60A and the discontinuous surface 54A. Accordingly, part of light generated in the scintillator layer 30 is reflected by the crystal interface 31A and enters the light receiving surface 60A. Therefore, high resolution is achieved. Accordingly, it is possible to achieve higher image quality in an image.

(3. Modifications of First and Second Embodiments)

Next, description will be provided of modifications of the radiation detectors 1 and 2 according to the above-described first and second embodiments.

(Modification 1)

As shown in FIGS. 3 and 4, in the above-described first embodiment, for example, the top surface of the insulating layer III or the top surface of the substrate 121 serves as the light receiving surface 20A of each device 20. However, as shown in FIGS. 27 and 28, for example, when each device 20 includes a protective film 118 that is in contact with the top surface of the insulating layer 111 or of the photoelectric conversion device 120, a top surface of the protective film 118 serves as the light receiving surface 20A. As shown in FIG. 18, in the above-described second embodiment, for example, the top surface of the insulating layer 111 serves as the light receiving surface 60A of each device 60. However, as shown in FIG. 29, for example, when each device 60 includes a protective film 119 that is in contact with the top surface of the insulating layer 111, a top surface of the protective film 119 serves as the light receiving surface 60A. The protective films 118 and 119 are each may be configured, for example, of an organic film made of parylene C.

The protective film 118 may be formed separately for each device 20, or may be formed to be shared by a plurality of devices 20. When the protective film 118 is formed to be shared by a plurality of devices 20, for example, the protective film 118 may be configured of a single film that is formed not only on the top surface of each device 20 but also on the top surface of the embedding layer 15 as shown in FIG. 30. In this case, a portion, of the protective film 118, that corresponds to the bottom surface of the spacing between the two adjacent devices 20 serves as a discontinuous surface 118A that is discontinuous with respect to the light receiving surface 20A.

Similarly, the protective film 119 may be formed separately for each device 60, or may be formed to be shared by a plurality of devices 60. When the protective film 119 is formed to be shared by a plurality of devices 60, for example, the protective film 119 may be configured of a single film that is formed not only on the top surface of each device 60 but also on the top surface of the embedding layer 54 as shown in FIG. 31. In this case, a portion, of the protective film 119, that corresponds to the bottom surface of the spacing between the two adjacent devices 60 serves as a discontinuous surface 119A that is discontinuous with respect to the light receiving surface 60A.

In the present modification, the protective film 118 or 119 serves as the light receiving surfaces 20A or 60A, respectively. In other words, the protective film 118 or 119 serves as the crystal growth surface of the scintillator layer 30. Also in such cases, it is possible to achieve light reception efficiency that is higher, for example, than light reception efficiency in a case where a member only used for allowing the scintillator layer 30 to grow thereon is provided between the light receiving surface 20A or 60A and the scintillator layer 30. Accordingly, it is possible to achieve higher image quality in an image also in the present modification.

(Modification 2)

In the above-described first embodiment, the plurality of photoelectric conversion regions 122 are provided in correspondence with the devices 20 in a one-to-one relationship. However, as shown in FIG. 32A, for example, a plurality of photoelectric conversion regions 122 may be provided in a common substrate 70. The substrate 70 is configured of a semiconductor substrate, and a semiconductor layer including the plurality of photoelectric conversion regions 122 that is formed on the semiconductor substrate. In the substrate 70, the semiconductor substrate is arranged in a position closer to the light receiving surface 20A. The plurality of photoelectric conversion regions 122 are arranged to be away from one another in the substrate 70. Accordingly, a plurality of light receiving surfaces 20A in positions opposing the photoelectric conversion regions 122 are also arranged to be away from one another in the top surface of the semiconductor substrate. The substrate 70 (or the semiconductor substrate) includes a groove 70A around the light receiving surface 20A. A bottom surface of the groove 70A configures a discontinuous surface 70B that is discontinuous with respect to the light receiving surface 20A. It is to be noted that, in the present modification, for example, as shown in FIG. 32B, the radiation detector 1 may include, instead of the circuit substrate 10, the wiring substrate 90 that supports the substrate 70, and may further include the circuit substrate 95 at the peripheral edge of the wiring substrate 90 (specifically, outside the radiation application region). This allows the circuit substrate 95 to be less exposed to radiation, which improves tolerance of the radiation detector 1 to radiation. Also, in the radiation detector 1 shown in FIG. 32B, for example, as shown in FIG. 32C, the plurality of switch devices 13S may be provided in the substrate 70 instead of the wiring substrate 90. In this case, the photoelectric conversion regions 122 and the switch devices 13S (that is, the substrate 70 including the photoelectric conversion regions 122 and the switch devices 13S) may be preferably configured of crystalline silicon. In such a case, improvement in switching speed of the switch device 13S is achieved, in addition to reduction of the afterimage included in the image obtained by the radiation detector 1.

In the above-described second embodiment, the plurality of photoelectric conversion regions 122 and the plurality of pixel circuit ICs 160 are provided in correspondence with the devices 60 in a one-to-one relationship. However, as shown in FIG. 33, for example, a plurality of photoelectric conversion regions 122 and a plurality of pixel circuit ICs 160 may be provided in a common substrate 80. The substrate 80 is formed by forming a semiconductor layer including a plurality of photoelectric conversion regions 122 on a semiconductor substrate, and then, mounting a plurality of pixel circuit ICs 160 on the semiconductor substrate to be embedded in the substrate 80. In the substrate 80, the semiconductor substrate is arranged in a position closer to the light receiving surface 60A. The plurality of photoelectric conversion regions 122 are arranged to be away from one another in the substrate 80. Accordingly, also the plurality of light receiving surfaces 60A in positions opposing the photoelectric conversion regions 122 are arranged to be away from one another in the top surface of the semiconductor substrate. The substrate 80 (or the semiconductor substrate) has a groove 80A around the light receiving surface 60A. A bottom surface of the groove 60A configures a discontinuous surface 80B that is discontinuous with respect to the light receiving surface 60A.

In the present modification, the groove 70A or 80A is provided in the substrate 70 or 80 by a method such as etching, and thereby, the light receiving surface 20A or 60A surrounded by the discontinuous surface 70B or 80B is formed, respectively. In such a manner, by using an etching technique instead of the above-described transfer technique, it is possible to achieve discontinuity between the light receiving surface 20A or 60A and the discontinuous surface 70B or 80B, respectively. Thus, the crystal interface 31A that extends in the thickness direction of the scintillator layer 30 is formed in a region opposing the discontinuous surface 70B or 80B. Accordingly, it is possible to achieve higher image quality in an image also in the present modification.

(Modification 3)

In the above-described first embodiment, the plurality of photoelectric conversion regions 122 are provided in correspondence with the devices 20 in a one-to-one relationship. However, as shown in FIG. 34, for example, a plurality of photoelectric conversion regions 122 may be provided in a common substrate 73. The substrate 73 is configured of a semiconductor substrate, and a semiconductor layer including a plurality of photoelectric conversion regions 122 formed on the semiconductor substrate. In the substrate 73, the semiconductor substrate is arranged in a position closer to the light receiving surface 20A. The plurality of photoelectric conversion regions 122 are arranged to be away from one another in the substrate 73. Therefore, a plurality of light receiving surfaces 20A in positions opposing the photoelectric conversion regions 122 are also arranged to be away from one another in a top surface of the semiconductor substrate. A radiation detector 1 according to the present modification includes a light blocking layer 74 around the light receiving surface 20A in a top surface of the substrate 73 (or the semiconductor substrate). The light blocking layer 74 includes a material that has light non-transmission characteristics. A top surface of the light blocking layer 74 configures a discontinuous surface 74A that is discontinuous with respect to the light receiving surface 20A.

In the above-described second embodiment, the plurality of photoelectric conversion regions 122 and the plurality of pixel circuit ICs 160 are provided in correspondence with the devices 60 in a one-to-one relationship. However, as shown in FIG. 35, for example, a plurality of photoelectric conversion regions 122 and a plurality of pixel circuit ICs 160 may be provided in a common substrate 81. The substrate 81 is configured by forming, on a semiconductor substrate, a semiconductor layer including a plurality of photoelectric conversion regions 122, and then, a plurality of pixel circuit ICs 160 are mounted on the semiconductor layer to be embedded in the substrate 81. In the substrate 81, the semiconductor substrate is arranged in a position closer to the light receiving surface 60A. The plurality of photoelectric conversion regions 122 are arranged to be away from one another in the substrate 81. Therefore, the plurality of light receiving surfaces 60A in positions opposing the photoelectric conversion regions 122 are also arranged to be away from one another in the top surface of the semiconductor substrate. The substrate 81 (or the semiconductor substrate) includes a light blocking layer 82 around the light receiving surface 60A. The light blocking layer 82 includes a material that has light non-transmission characteristics. A top surface of the light blocking layer 82 configures a discontinuous surface 82A that is discontinuous with respect to the light receiving surface 60A.

In the present modification, the scintillator layer 30 includes a scintillator section 32 that is formed with the use of the discontinuous surface 74A or 82A as a crystal growth surface. The scintillator section 32 has a crystal interface that extends in the thickness direction of the scintillator layer 30 in a region opposing the discontinuous surface 74A or 82A. The crystal interface of the scintillator section 32 may be arranged, for example, to oppose the scintillator interface 31A of the scintillator section 31 with a predetermined spacing in between. It is to be noted that the crystal interface of the scintillator section 32 may be formed in contact with the crystal interface 31A of the scintillator section 31.

In the present modification, the light blocking layer 74 or 82 is provided on the top surface of the substrate 73 or 81, and thereby, the light receiving surface 20A or 60A surrounded by the discontinuous surface 74A or 82A is formed. In such a manner, by using a film formation technique instead of the above-described transfer technique, it is possible to achieve discontinuity between the light receiving surface 20A or 60A and the discontinuous surface 74A or 82A, respectively. Thus, the crystal interface 31A that extends in the thickness direction of the scintillator layer 30 is formed in a region opposing the discontinuous surface 74A or 82A. Accordingly, it is possible to achieve higher image quality in an image also in the present modification.

(4. Third Embodiment)

Next, description will be provided of a radiation detector 3 according to a third embodiment. FIG. 36 illustrates an example of a cross-sectional configuration of the radiation detector 3. The radiation detector 3 is configured of a plurality of radiation detectors 1 or 2 according to the above-described embodiments and the modifications thereof that are arranged in a matrix in a plane. Therefore, it is possible to achieve higher image quality in an image also in the radiation detector 3 as in the above-described embodiments and the modifications thereof.

(5. Modifications)

In the first and second embodiments and the modifications thereof, the scintillator layer 30 is formed on the top surface of each device 20 or 60. In a similar manner, the scintillator layer 30 is formed on the top surface of each device 20 or 60 also in the third embodiment. However, as shown in FIGS. 37, 38, and 39, for example, the scintillator layer 30 may be omitted. However, in this case, the photoelectric conversion device 120 (or the photoelectric conversion region 122) included in each device 20 or 60 uses a direct conversion method by which radiation is directly converted into an electric signal. In the present modification, the photoelectric conversion region 122 may be formed, for example, of semiconductor crystal such as cadmium telluride (CdTe).

In the present modification, the scintillator layer 30 is omitted, and the photoelectric conversion device 120 uses the direct conversion method by which radiation is directly converted into an electric signal. Therefore, it is possible to achieve resolution higher than resolution in a case where the photoelectric conversion device 120 uses the indirect conversion method. Accordingly, it is possible to achieve higher image quality in an image.

(6. Fourth Embodiment)

Next, description will be provided of an imaging unit 4 according to a fourth embodiment. FIG. 40 illustrates an example of a schematic configuration of the imaging unit 4. The imaging unit 4 uses any of the above-described radiation detectors 1 to 3 in a pixel section. The imaging unit 4 may be suitably used as an imaging unit for medical application, or for other non-destructive inspection application such as for baggage inspection. The imaging unit 4 may include, for example, a pixel section 420 on a substrate 410, and a drive section in a peripheral region of the pixel section 420. The drive section drives the pixel section 420. The drive section may include, for example, a row scanning section 430, a horizontal selection section 440, a column scanning section 450, and a system control section 460.

The pixel 420 serves as an imaging area in the imaging unit 4. The pixel section 420 is configured of the radiation detectors 1, 2, or 3. When the pixel section 420 is configured of the radiation detectors 1 or the radiation detectors 3 each including a plurality of radiation detectors 1, a pair of the photoelectric conversion device 120 and the pixel circuit 13 configures a unit pixel P. When the pixel section 420 is configured of the radiation detectors 2 or the radiation detectors 3 each including a plurality of radiation detectors 2, a pair of the photoelectric conversion device 120 and the pixel circuit IC 160 configures the unit pixel P.

In the pixel section 420, a plurality of unit pixels P are arranged in a matrix. To each of the unit pixels P, two pixel drive lines 470 (specifically, a row selection line 471 and a reset control line 472 which will be described later) are connected. In the pixel section 420, a plurality of pixel drive lines 470 extend in a row direction, and a plurality of vertical signal lines 480 extend in a column direction. The vertical signal line 480 sends a drive signal for reading a signal from the unit pixel P. Each of the pixel drive lines 470 is connected to an output terminal of the row scanning section 430 and to the pixel section 420. Each of the vertical signal lines 480 is connected to an input terminal of the horizontal selection section 440 and to the pixel section 420.

The row scanning section 430 is configured of components such as a shift register and an address decoder. The row scanning section 430 is a pixel drive section that may drive the respective unit pixels P in the pixel section 420, for example, on a row-unit basis. A signal outputted from each unit pixel P in a pixel row selectively scanned by the row scanning section 430 is supplied to the horizontal selection section 440 via each vertical signal line 480. The horizontal selection section 440 may be configured, for example, of components such as an amplifier and a horizontal selection switch provided for each vertical signal line 480.

The column scanning section 450 may be configured, for example, of components such as a shift register and an address decoder. The column scanning section 450 sequentially drives the respective horizontal selection switches in the horizontal selection section 440 while scanning the respective horizontal selection switches in the horizontal selection section 440. As a result of selective scanning by the column scanning section 450, signals from the respective unit pixels P sent via the respective vertical signal lines 480 are sequentially outputted to a horizontal signal line 490, and the outputted signals are sent to outside of the substrate 410 via the horizontal signal line 490.

A circuit part configured of the row scanning section 430, the horizontal selection section 440, the column scanning section 450, and the horizontal signal line 490 may be directly formed on the substrate 410, or may be arranged in an external control IC. Alternatively, such a circuit part may be formed on another substrate connected to the imaging unit 4 with the use of the cable.

The system control section 460 may receive, for example, a clock supplied from the outside of the substrate 410, data instructing an operation mode, etc. The system control section 460 outputs data such as internal information of the imaging unit 4. The system control section 460 includes a timing generator that generates various timing signals. The system control section 460 performs drive control of peripheral circuits such as the row scanning section 430, the horizontal selection section 440, and the column scanning section 450, based on the various timing signals generated by the timing generator.

(Pixel Circuit 13 or Pixel Circuit Section 161)

FIG. 41 illustrates an example of a schematic configuration of the pixel circuit 13 or the pixel circuit section 161. The pixel circuit 13 or the pixel circuit section 161 may include, for example, transistors Tr1, Tr2, and Tr3, and a capacitive component Cs. The photoelectric conversion device 120 is connected between a terminal 421 to which a reference electric potential Vxref is applied and an accumulation node N.

The transistor Tr1 is a reset transistor. The transistor Tr1 is connected between a terminal 422 to which a reference electric potential Vref is supplied and the accumulation node N. A gate of the transistor Tr1 is connected to a reset control line 472. The transistor Tr1 is turned on in response to a reset signal Vrst, and thereby, resets an electric potential of the accumulation node N to the reference potential Vref. The transistor Tr2 is a reading transistor. A gate of the transistor Tr2 is connected to the accumulation node N, and a terminal 423 (a drain) of the transistor Tr2 is connected to a power source VDD. The transistor Tr2 receives, at a gate thereof, a signal electric charge generated in the photoelectric conversion device 120, and outputs a signal voltage based on the received signal electric charge. The transistor Tr3 is a row selection transistor. The transistor Tr3 is connected between a source of the transistor Tr2 and the vertical signal line 480. A gate of the transistor Tr3 is connected to the row selection line 471. The transistor Tr3 is turned on in response to a row scanning signal Vread, and thereby, outputs, to the vertical signal line 480, the signal supplied from the transistor Tr2. The transistor Tr3 may be connected between the drain of the transistor Tr2 and the power source VDD. The accumulation node N includes the capacitive component Cs, and the signal electric charge generated in the photoelectric conversion device 120 is accumulated in the accumulation node N.

In the present embodiment, any of the above-described radiation detectors 1 to 3 is used in the pixel section 420. Accordingly, it is possible to achieve an image with higher image quality.

(7. Fifth Embodiment)

Next, description will be provided of an imaging and display system 5 according to a fifth embodiment. FIG. 42 illustrates an example of a schematic configuration of the imaging and display system 5. The imaging and display system 5 includes the above-described imaging unit 4 with the pixel section 420 configured including any of the radiation detectors 1 to 3. The imaging and display system 5 may include, for example, the imaging unit 4, an image processing section 6, and a display unit 7. The image processing section 6 performs a predetermined image process on an imaging signal Dout obtained by the imaging unit 4. The display unit 7 performs image display based on the imaging signal Dout obtained by the imaging unit 4. Specifically, the display unit 7 displays an image based on an imaging signal (a display signal D1) after being subjected to the process in the image processing section 6.

In the present embodiment, the imaging unit 4 detects a component that has passed through a subject 400 out of radiation irradiated from a radiation source 300 toward the subject 400. The imaging signal Dout obtained by detection of such a component by the imaging unit 4 is subjected to a predetermined process in the image processing section 6. The imaging signal (the display signal D1) that has been subjected to the predetermined process is outputted to the display unit 7. Accordingly, an image based on the display signal D1 is displayed on a monitor screen of the display unit 7.

In the present embodiment, any of the above-described radiation detectors 1 to 3 is used in the imaging unit 4 in such a manner. Accordingly, it is possible to achieve an image with higher image quality.

(8. Sixth Embodiment)

Next, an imaging system 6 according to a sixth embodiment is described. FIG. 43 illustrates an example of a schematic configuration of the imaging system 6. The imaging system 6 further includes a forming unit 8 in the imaging display system 5. The forming unit 8 is configured to form a three-dimensional structure based on an imaging signal (3DCAD (computer-aided design) signal D2) that has been processed by the image processing section 6. The forming unit 8 may be, for example, a 3D printer. The image processing section 6 generates the 3DCAD signal D2 by performing a predetermined image process on an imaging signal Dout. It is to be noted that the display unit 7 may be omitted on a necessary basis. Also, the forming unit 8 may be configured to be allowed to be attached later to the imaging system 6.

In the present embodiment, any of the above-described radiation detectors 1 to 3 is used in the imaging unit 4. It is therefore possible to form a three-dimensional structure with high accuracy.

Hereinabove, the present technology has been described referring to some embodiments and the modifications thereof. However, the present technology is not limited to the above-described embodiments and modifications thereof, and may be variously modified. It is to be noted that the effects described in the present description are mere examples. The effects of the present technology are not limited to the effects described in the present description. The present technology may have an effect other than the effects described in the present description.

For example, in each of the above-described embodiments and the modifications thereof, the discontinuous surface 15A, 54A, 70B, 74A, 80B, 82A, 94A, 103A, 118A, or 119A may be omitted, or may be planarized in the relationship with the light receiving surface 20A or 60A.

Moreover, the present technology may have, for example, the following configurations.

(1)

A radiation detector including:

a plurality of photoelectric conversion regions each configured to convert light incident on a light receiving surface into a current signal;

a discontinuous surface formed around the light receiving surface, the discontinuous surface being discontinuous with respect to the light receiving surface; and a scintillator layer formed with use of the light receiving surface as a crystal growth surface and configured to convert incident radiation into light.

(2)

The radiation detector according to (1), wherein the scintillator layer includes a crystal interface in a region opposing the discontinuous surface, and includes a plurality of scintillator sections, the crystal interface extending in a thickness direction of the scintillator layer, and the crystal interface separating the plurality of scintillator sections from one another to allow the plurality of scintillator sections to be provided in correspondence with the plurality of photoelectric conversion regions in a one-to-one relationship.

(3)

The radiation detector according to (2), wherein
a width of a spacing between two adjacent scintillator sections in the plurality of scintillator sections is reduced as a position of the width is farther from the discontinuous surface and is closer to an upper portion of the scintillator section.

(4)

The radiation detector according to any one of (1) to (3), wherein
the plurality of photoelectric conversion regions are formed in a plurality of chip-like devices in a one-to-one relationship, and a bottom surface of a spacing between two adjacent devices in the plurality of chip-like devices configures the discontinuous surface.

(5)

The radiation detector according to (4), wherein
each of the devices includes a photoelectric conversion device and an insulating layer, the photoelectric conversion device including the photoelectric conversion region, and the insulating layer being arranged above the photoelectric conversion device and supporting the photoelectric conversion device, and
a top surface of the insulating layer configures the light receiving surface.

(6)

The radiation detector according to (4), wherein
each of the devices is a photoelectric conversion device including the photoelectric conversion region, and
a top surface of the photoelectric conversion device configures the light receiving surface.

(7)

The radiation detector according to (4), wherein
each of the devices includes a photoelectric conversion device, an insulating layer, and a protective film, the photoelectric conversion device including the photoelectric conversion region, the insulating layer being arranged above the photoelectric conversion device and supporting the photoelectric conversion device, and the protective film being in contact with a top surface of the insulating layer, and
a top surface of the protective film configures the light receiving surface.

(8)

The radiation detector according to (4), wherein
each of the devices includes a photoelectric conversion device and a protective film, the photoelectric conversion device including the photoelectric conversion region, and the protective film being in contact with a top surface of the photoelectric conversion device, and
a top surface of the protective film configures the light receiving surface.

(9)

The radiation detector according to any one of (1) to (8), further including a light blocking layer formed below the devices.

(10)

The radiation detector according to (4), further including:
a switch device included in each of the devices and connected in series to the photoelectric conversion region;
a wiring substrate including a plurality of wirings on a support substrate and supporting each of the devices, the plurality of wirings being electrically connected to the respective switch devices; and
a circuit substrate including a plurality of conversion circuits connected to respective ends of the wirings and each configured to convert the current signal into a voltage signal, wherein
the photoelectric conversion regions and the switch devices are each made of crystalline silicon.

(11)

The radiation detector according to (4), further including:
a wiring substrate including a plurality of switch devices and a plurality of wirings on a support substrate and supporting each of the devices, the plurality of switch devices being connected in series to the respective photoelectric conversion regions, and the plurality of wirings being connected to the respective switch devices; and
a circuit substrate including a plurality of conversion circuits connected to respective ends of the wirings and each configured to convert the current signal into a voltage signal, wherein
the photoelectric conversion regions are each made of crystalline silicon.

(12)

The radiation detector according to (2) or (3), further including a semiconductor substrate including the plurality of photoelectric conversion regions formed thereon, wherein
the semiconductor substrate includes a groove around the light receiving surface, and
a bottom surface of the groove configures the discontinuous surface.

(13)

The radiation detector according to (12), further including:
a plurality of switch devices included in the semiconductor substrate and connected in series to the respective photoelectric conversion regions;
a wiring substrate including a plurality of wirings on a support substrate and supporting the semiconductor substrate, the plurality of wirings being electrically connected to the respective switch devices; and
a circuit substrate including a plurality of conversion circuits connected to respective ends of the wirings and each configured to convert the current signal into a voltage signal, wherein
the photoelectric conversion regions and the switch devices are each made of crystalline silicon.

(14)

The radiation detector according to (12), further including:
a wiring substrate including a plurality of switch devices and a plurality of wirings on a support substrate and supporting the semiconductor substrate, the plurality of switch devices being connected in series to the respective photoelectric conversion regions, and the plurality of wirings being connected to the respective switch devices; and
a circuit substrate including a plurality of conversion circuits connected to respective ends of the wirings and each configured to convert the current signal into a voltage signal, wherein
the photoelectric conversion regions are each made of crystalline silicon.

(15)

The radiation detector according to (2) or (3), further including:
a semiconductor substrate including the plurality of photoelectric conversion regions formed thereon; and
a light blocking section formed in a region, of a top surface of the semiconductor substrate, around the light receiving surface, wherein
a top surface of the light blocking section configures the discontinuous surface.

(16)
An imaging unit including:
a radiation detector; and
a drive section configured to drive the radiation detector,
the radiation detector including
a plurality of photoelectric conversion regions each configured to convert light incident on a light receiving surface into a current signal,
a discontinuous surface formed around the light receiving surface, the discontinuous surface being discontinuous with respect to the light receiving surface,
a plurality of conversion circuits provided in correspondence with the plurality of photoelectric conversion regions in a one-to-one relationship and each configured to convert the current signal into a voltage signal, and
a scintillator layer formed with use of the light receiving surface as a crystal growth surface and configured to convert incident radiation into light.

(17)
The imaging unit according to (16), wherein the scintillator layer includes a crystal interface in a region opposing the discontinuous surface, and includes a plurality of scintillator sections, the crystal interface extending in a thickness direction of the scintillator layer, and the crystal interface separating the plurality of scintillator sections from one another to allow the plurality of scintillator sections to be provided in correspondence with the plurality of photoelectric conversion regions in a one-to-one relationship.

(18)
An imaging and display system including:
an imaging unit; and
a display unit configured to perform image display based on an imaging signal obtained by the imaging unit,
the imaging unit including
a radiation detector, and
a drive section configured to drive the radiation detector,
the radiation detector including
a plurality of photoelectric conversion regions each configured to convert light incident on a light receiving surface into a current signal,
a discontinuous surface formed around the light receiving surface, the discontinuous surface being discontinuous with respect to the light receiving surface,
a plurality of conversion circuits provided in correspondence with the plurality of photoelectric conversion regions in a one-to-one relationship and each configured to convert the current signal into a voltage signal, and
a scintillator layer formed with use of the light receiving surface as a crystal growth surface and configured to convert incident radiation into light.

(19)
The imaging and display system according to (18), wherein the scintillator layer includes a crystal interface in a region opposing the discontinuous surface, and includes a plurality of scintillator sections, the crystal interface extending in a thickness direction of the scintillator layer, and the crystal interface separating the plurality of scintillator sections from one another to allow the plurality of scintillator sections to be provided in correspondence with the plurality of photoelectric conversion regions in a one-to-one relationship.

(20)
A method of manufacturing a radiation detector, the method including:
transferring, to a substrate, part or all of a plurality of devices included in a device substrate, the plurality of devices being fixed onto a support substrate included in the device substrate, and the plurality of devices each being configured to convert light incident on a light receiving surface into a current signal; and
forming a scintillator layer with use of the light receiving surface as a crystal growth surface, the scintillator layer being configured to convert incident radiation into light.

(21)
The method according to (20), including:
at time of transferring of the part or all of the plurality of devices to the substrate, forming a discontinuous surface between two adjacent devices in the plurality of devices, the discontinuous surface being discontinuous with respect to the light receiving surface,
at time of forming the scintillator layer, forming a crystal interface in a region opposing the discontinuous surface and forming a plurality of scintillator sections allocated, by the crystal interface, to the devices in a one-to-one relationship, the crystal interface extending in a thickness direction of the scintillator layer.

Moreover, the present technology may have, for example, the following configurations.

(22)
A radiation detector including:
a plurality of photoelectric conversion regions each configured to convert light incident on a light receiving surface into a current signal, the photoelectric conversion regions each being made of crystalline silicon; and
a scintillator layer formed with use of the light receiving surface as a crystal growth surface and configured to convert incident radiation into light.

(23)
The radiation detector according to (22), further including:
a plurality of switch devices connected in series to the respective photoelectric conversion regions,
the photoelectric conversion regions and the switch devices being allocated to the pixels in a one-to-one relationship,
in each of the pixels, the switch device being formed on a common substrate together with the photoelectric conversion region and being made of crystalline silicon.

(24)
The radiation detector according to (23), further including:
a wiring substrate including, on a support substrate, a plurality of wirings connected to the respective switch devices and supporting the respective photoelectric conversion regions and the respective switch devices with the substrate in between; and
a circuit substrate including a plurality of conversion circuits connected to respective ends of the wirings and each configured to convert the current signal into a voltage signal.

(25)
The radiation detector according to (24), wherein the support substrate is one of a glass substrate and a resin substrate.

(26)
The radiation detector according to any one of (23) to (25), wherein the photoelectric conversion regions are formed in chip-like devices in a one-to-one relationship for the respective pixels and the switch devices are formed in chip-like devices in a one-to-one relationship for the respective pixels.

(27)
The radiation detector according to any one of (23) to (25), wherein the respective photoelectric conversion regions and the respective switch devices are formed on the common substrate.

(28)
The radiation detector according to (22), further including
a wiring substrate including a plurality of switch devices and a plurality of wirings on a support substrate, and supporting the respective photoelectric conversion regions, the switch devices being connected in series to the respective photoelectric conversion regions, and the plurality of wirings being connected to the respective switch devices.

(29)
The radiation detector according to (28), wherein the support substrate is one of a glass substrate and a resin substrate.

(30)
The radiation detector according to (28) or (29), wherein the photoelectric conversion regions are formed in chip-like devices in a one-to-one relationship.

(31)
The radiation detector according to (28) or (29), wherein the respective photoelectric conversion regions are formed on a common substrate.

(32)
A radiation detector, comprising:
a plurality of photoelectric conversion devices, each photoelectric conversion device formed at least partially within an embedding layer and having a light receiving surface situated at least partially outside of the embedding layer; and
a plurality of scintillator crystals, at least a first scintillator crystal of the plurality of scintillator crystals in contact with at least one light receiving surface at a proximal end, wherein a cross-section of the first scintillator crystal at the proximal end is smaller than a cross-section of the first scintillator crystal at a distal end.

(33)
The radiation detector of (32), wherein the first scintillator crystal is configured to convert incident radiation into light.

(34)
The radiation detector of (32), further comprising a space between the first scintillator crystal and a second scintillator crystal adjacent to the first scintillator crystal.

(35)
The radiation detector of (34), wherein the first scintillator crystal contacts the second scintillator crystal of the plurality of scintillator crystals at the distal end of the first scintillator crystal.

(36)
The radiation detector of (32), wherein a surface of the first scintillator crystal is curved between the proximal end and the distal end.

(37)
The radiation detector of (32), further comprising a light reflecting surface in contact with the first scintillator crystal at the distal end.

(38)
The radiation detector of (32), wherein the embedding layer comprises a light blocking material.

(39)
The radiation detector of (38), wherein the embedding layer comprises a silicone-based resin.

(40)
The radiation detector of (32), wherein at least a first photoelectric conversion device of the plurality of photoelectric conversion devices includes an insulating layer, a semiconductor layer and an electrode coupled to the semiconductor layer.

(41)
The radiation detector of (32), further comprising:
a plurality of switch devices connected in series to the plurality of photoelectric conversion devices;
a wiring substrate including a plurality of wirings on a support substrate, the plurality of wirings being electrically connected to respective switch devices of the plurality of switch devices; and
a circuit substrate including a plurality of conversion circuits connected to ends of the wirings and configured to convert a current signal into a voltage signal,
wherein the plurality of photoelectric conversion devices and the plurality of switch devices are made of crystalline silicon.

(42)
The radiation detector of (32), further comprising:
a wiring substrate including a plurality of switch devices and a plurality of wirings on a support substrate, the plurality of switch devices being connected in series to respective photoelectric conversion devices, and the plurality of wirings being connected to respective switch devices; and
a circuit substrate including a plurality of conversion circuits connected to respective ends of the wirings and configured to convert a current signal into a voltage signal,
wherein the photoelectric conversion devices are made of crystalline silicon.

(43)
A method of forming a radiation detector, comprising:
forming a plurality of photoelectric conversion devices on a substrate, at least a first photoelectric conversion device of the plurality of photoelectric conversion devices including one or more electrodes, wherein the first photoelectric conversion device is formed such that at least one of the one or more electrodes are coupled to a circuit formed within the substrate;
forming an embedding layer on the substrate such that at least a portion of the first photoelectric conversion device is embedded within the embedding layer; and
forming a scintillator layer on a surface of the first photoelectric conversion layer.

(44)
The method of (43), wherein the embedding layer comprises a silicone-based resin.

(45)
The method of (43), wherein the scintillator layer is formed via vacuum deposition.

(46)
An imaging unit, comprising:
a radiation detector; and
a drive circuit configured to drive the radiation detector,
the radiation detector including:
a plurality of pixels, at least a first pixel of the plurality of pixels comprising:
a photoelectric conversion device formed at least partially within an embedding layer and having a light receiving surface situated at least partially outside of the embedding layer; and
a first scintillator crystal in contact with the light receiving surface at a proximal end, wherein a cross-section of the first scintillator crystal at the proximal end is smaller than a cross-section of the first scintillator crystal at a distal end.

(47)
The imaging unit of (46), further comprising an air gap between the first scintillator crystal and a second scintillator crystal in a second pixel adjacent to the first pixel.

(48)
The imaging unit of (47), wherein the first scintillator crystal contacts the second scintillator crystal at the distal end of the first scintillator crystal.
(49)
The imaging unit of (46), wherein a surface of the first scintillator crystal is curved between the proximal end and the distal end.
(50)
The imaging unit of (46), wherein the embedding layer comprises a light blocking material.
(51)
An imaging and display system comprising:
an imaging unit; and
a display unit configured to perform image display based on an imaging
signal obtained by the imaging unit,
the imaging unit including:
a radiation detector; and
a drive circuit configured to drive the radiation detector,
the radiation detector including:
a plurality of pixels, at least a first pixel of the plurality of pixels comprising:
a photoelectric conversion device formed at least partially within an embedding layer and having a light receiving surface situated at least partially outside of the embedding layer; and
a first scintillator crystal in contact with the light receiving surface at a proximal end, wherein a cross-section of the first scintillator crystal at the proximal end is smaller than a cross-section of the first scintillator crystal at a distal end.

It should be understood by those skilled in the art that various modifications, combinations, sub-combinations, and alterations may occur depending on design requirements and other factors insofar as they are within the scope of the appended claims or the equivalents thereof.

REFERENCE SIGNS LIST 1,2,3 Radiation detector
4 Imaging unit
5 Imaging and display system
6 Imaging system
7 Display unit
8 Forming unit
10, 10A Circuit substrate
11 Support substrate
12 Circuit layer
13 Pixel circuit
14 Pad electrode
15 Embedding layer
15A Discontinuous surface
20 Device
20A Light receiving surface
21 Function section
22 Electrode
23 Bump
30 Scintillator layer
30S Tangent plane
31, 32 Scintillator section
31A Crystal interface
40 Reflection plate
50, 50A Wiring substrate
51 Support substrate
52 Wiring layer
53 Pad electrode
54 Embedding layer
54A Discontinuous surface
60 Device
60A Light receiving surface
61 Function section
62 Electrode
63 Bump
70 Substrate
70A Groove
70B Discontinuous surface
73 Substrate
74 Light blocking layer
74A Discontinuous surface
80 Substrate
80A Groove
80B Discontinuous surface
81 Substrate
82 Light blocking layer
82A Discontinuous surface
90 Wiring substrate
91 Support substrate
92 Wiring layer
93 Pad electrode
94 Embedding layer
94A Discontinuous surface
100 Device substrate
101 Support substrate
102, 103 Fixing layer
103A Discontinuous surface
104 Air spacing
111 Insulating layer
112, 113 Insulating layer
114 Pad electrode
115 Wiring layer
116, 117 Connection section
118, 119 Protective film
118A, 119A Discontinuous surface
120 Photoelectric conversion device
121 Substrate
122 Photoelectric conversion region
123 Electrode
124 Bump
151, 152 Insulating layer
153 Pad electrode
154 Wiring layer
155 Connection section
160 Pixel circuit IC
161 Pixel circuit section
162 Electrode
163 Bump
200 Device substrate
201 Support substrate
202, 203 Fixing layer
203A Discontinuous surface
204 Air spacing
300 Radiation source
400 Subject
410 Substrate
420 Pixel section
430 Row scanning section
440 Horizontal selection section
450 Column scanning section
460 System control section
470 Pixel drive line
471 Row selection line
472 Reset control line
480 Vertical signal line 490 Horizontal signal line
D1 Display signal
D2 3DCAD signal
Dout Imaging signal
Tr1, Tr2, Tr3 Transistor
Cs Capacitive component
Theta 1, Theta 2 Angle

The invention claimed is:

1. A radiation detector, comprising:
an embedding layer;
a plurality of photoelectric conversion devices,
wherein at least a first photoelectric conversion device of the plurality of photoelectric conversion devices is partially within the embedding layer, and
wherein the at least first photoelectric conversion device comprises a light receiving surface that is at least partially outside of the embedding layer; and
a plurality of scintillator crystals, wherein a first scintillator crystal of the plurality of scintillator crystals is in contact with the light receiving surface at a proximal end of the first scintillator crystal,
wherein a first cross-section of the first scintillator crystal at the proximal end is smaller than a second cross-section of the first scintillator crystal at a distal end of the first scintillator crystal,
wherein the first scintillator crystal comprises a crystal interface that extends, on at least one outer surface of the first scintillator crystal, from the light receiving surface to the distal end, and
wherein the crystal interface is configured to reflect incident light towards the light receiving surface.

2. The radiation detector of claim 1,
wherein the first scintillator crystal is configured to convert incident radiation into visible light, and
wherein the incident radiation comprises at least one of alpha rays, beta rays, gamma rays, or X-rays.

3. The radiation detector of claim 1, further comprising an air space between the first scintillator crystal and a second scintillator crystal of the plurality of scintillator crystals, wherein the second scintillator crystal is adjacent to the first scintillator crystal.

4. The radiation detector of claim 3, wherein the first scintillator crystal is in contact with the second scintillator crystal at the distal end of the first scintillator crystal.

5. The radiation detector of claim 1, wherein a shape of the at least one outer surface of the first scintillator crystal between the proximal end and the distal end, is a curve.

6. The radiation detector of claim 1, further comprising a light reflecting surface in contact with the first scintillator crystal at the distal end.

7. The radiation detector of claim 1, wherein the embedding layer comprises a light blocking material.

8. The radiation detector of claim 1, wherein the embedding layer comprises a silicone-based resin.

9. The radiation detector of claim 1, wherein the at least first photoelectric conversion device further comprises an insulating layer, a semiconductor layer, and an electrode that is coupled to the semiconductor layer.

10. The radiation detector of claim 1, further comprising:
a plurality of switch devices connected in series to the plurality of photoelectric conversion devices;
a wiring substrate comprising a plurality of wirings on a support substrate, wherein each of the plurality of wirings is electrically connected to a respective switch device of the plurality of switch devices; and
a circuit substrate comprising a plurality of conversion circuits connected to ends of the plurality of wirings,
wherein the plurality of conversion circuits are configured to convert a current signal into a voltage signal, and
wherein the plurality of photoelectric conversion devices and the plurality of switch devices comprise crystalline silicon.

11. The radiation detector of claim 1, further comprising:
a wiring substrate comprising a plurality of switch devices and a plurality of wirings,
wherein each of the plurality of switch devices is connected in series to a respective photoelectric conversion device of the plurality of photoelectric conversion devices, and
wherein each of the plurality of wirings is on a support substrate and is connected to a respective switch device of the plurality of switch devices; and
a circuit substrate comprising a plurality of conversion circuits connected to respective ends of the plurality of wirings,
wherein the plurality of conversion circuits are configured to convert a current signal into a voltage signal, and
wherein each of the plurality of photoelectric conversion devices comprises crystalline silicon.

12. An imaging unit, comprising:
a radiation detector; and
a drive circuit configured to drive the radiation detector,
wherein the radiation detector comprises a plurality of pixels, and wherein at least a first pixel of the plurality of pixels comprises:
an embedding layer;
a photoelectric conversion device partially within the embedding layer, wherein the photoelectric conversion device comprises a light receiving surface that is at least partially outside of the embedding layer; and
a first scintillator crystal in contact with the light receiving surface at a proximal end of the first scintillator crystal,
wherein a first cross-section of the first scintillator crystal at the proximal end is smaller than a second cross-section of the first scintillator crystal at a distal end of the first scintillator crystal,
wherein the first scintillator crystal comprises a crystal interface that extends, on at least one outer surface of the first scintillator crystal, from the light receiving surface to the distal end, and
wherein the crystal interface is configured to reflect incident light towards the light receiving surface.

13. The imaging unit of claim 12, further comprising an air gap between the first scintillator crystal and a second scintillator crystal, wherein the second scintillator crystal is in a second pixel that is adjacent to the first pixel.

14. The imaging unit of claim 13, wherein the first scintillator crystal is in contact with the second scintillator crystal, at the distal end of the first scintillator crystal.

15. The imaging unit of claim 12, wherein a shape of the at least one outer surface of the first scintillator crystal between the proximal end and the distal end, is a curve.

16. The imaging unit of claim 12, wherein the embedding layer comprises a light blocking material.

17. A system, comprising:
an imaging unit configured to obtain an imaging signal; and
a display unit configured to display an image based on the imaging signal, wherein the imaging unit comprises:
a radiation detector; and
a drive circuit configured to drive the radiation detector,
wherein the radiation detector comprises a plurality of pixels, and wherein at least a first pixel of the plurality of pixels comprises:
an embedding layer;
a photoelectric conversion device partially within the embedding layer, wherein the photoelectric conversion device comprises a light receiving surface that is at least partially outside of the embedding layer; and
a first scintillator crystal in contact with the light receiving surface at a proximal end of the first scintillator crystal,
wherein a first cross-section of the first scintillator crystal at the proximal end is smaller than a second cross-section of the first scintillator crystal at a distal end of the first scintillator crystal,
wherein the first scintillator crystal comprises a crystal interface that extends, on at least one outer surface of the first scintillator crystal, from the light receiving surface to the distal end, and
wherein the crystal interface is configured to reflect incident light towards the light receiving surface.

* * * * *